United States Patent
Dyer et al.

(10) Patent No.: US 6,169,819 B1
(45) Date of Patent: Jan. 2, 2001

(54) HIGH PERFORMANCE SURFACE NORMAL COMPRESSION

(75) Inventors: Don W. Dyer, Ft. Collins; Samuel C. Sands, Loveland, both of CO (US)

(73) Assignee: Hewlett-Packard Company, Palo Alto, CA (US)

(*) Notice: Under 35 U.S.C. 154(b), the term of this patent shall be extended for 0 days.

(21) Appl. No.: 09/183,192

(22) Filed: Oct. 31, 1998

(51) Int. Cl.[7] .............................. G06K 9/36; G06K 9/46
(52) U.S. Cl. ..................... 382/232; 345/419; 382/154
(58) Field of Search ................................ 382/154, 232; 341/76; 345/139, 202, 418–420, 423–424, 426–427; 348/414.1, 417.1, 418.1, 422.1; 358/426; 375/240.08, 240.22

(56) References Cited

U.S. PATENT DOCUMENTS 6,088,034 * 7/2000 Deering ................................ 345/420

* cited by examiner

*Primary Examiner*—Amelia Au
*Assistant Examiner*—Timothy M. Johnson
(74) *Attorney, Agent, or Firm*—Morley F. Tobey

(57) ABSTRACT

A high performance method for the compression of floating point format surface normals and the inverse method for the decompression of those compressed surface normals. Each of the three vector components of the surface normal is compressed by subtracting a constant from the floating point format value, then extracting a predefined field, and finally storing the extracted field. Decompression of the compressed surface normal requires first converting the three stored vector components into floating-point format and then adding a predefined constant to each. Typically the surface normals are of unit length.

29 Claims, 22 Drawing Sheets

FIG. 4

| Bit Position | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| LARGEST NON-COMPRESSED NUMBER 410 (1.0 =>) | 0 | 0 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| SMALLEST, NON-ZERO NON-COMPRESSED NUMBER 420 (0.064 =>) | 0 | 0 | 1 | 1 | 1 | 1 | 0 | 1 | 0 | 0 | 0 | 0 | 0 | 0 | 1 | 1 | 0 | 0 | 0 | 0 | 0 | 1 | 1 | 0 | 0 | 1 | 1 | 0 | 1 | 0 | 1 | 0 |

SUBTRACT SMALLEST, NON-ZERO NON COMPRESSED NUMBER 420 FROM LARGEST NON COMPRESSED NUMBER 410 AS IF BOTH WERE BINARY NUMBERS

| Bit Position | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| SUBTRACTION RESULT 430 / 440 | 0 | 0 | 0 | 0 | 0 | 0 | 1 | 0 | 1 | 1 | 1 | 1 | 1 | 1 | 0 | 1 | 1 | 1 | 1 | 1 | 1 | 0 | 1 | 1 | 1 | 0 | 0 | 1 | 0 | 0 | 0 | 0 |
| EXTRACTION FIELD 460 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

(450 indicates the extraction field range)

| BIT POSITION | ROUND DOWN CONSTANT 510 | ROUND NEAREST CONSTANT 520 | ROUND UP CONSTANT 530 |
|---|---|---|---|
| 0 | 0 | 0 | 1 |
| 1 | 0 | 0 | 1 |
| 2 | 0 | 0 | 1 |
| 3 | 0 | 0 | 1 |
| 4 | 0 | 0 | 1 |
| 5 | 0 | 0 | 1 |
| 6 | 0 | 0 | 1 |
| 7 | 0 | 0 | 1 |
| 8 | 0 | 0 | 1 |
| 9 | 0 | 0 | 1 |
| 10 | 0 | 0 | 1 |
| 11 | 0 | 0 | 1 |
| 12 | 0 | 0 | 1 |
| 13 | 0 | 0 | 1 |
| 14 | 0 | 0 | 1 |
| 15 | 0 | 1 | 1 |
| 16 | 0 | 1 | 1 |
| 17 | 0 | 1 | 1 |
| 18 | 0 | 1 | 1 |
| 19 | 0 | 1 | 1 |
| 20 | 0 | 1 | 1 |
| 21 | 0 | 1 | 1 |
| 22 | 0 | 1 | 1 |
| 23 | 0 | 1 | 1 |
| 24 | 0 | 1 | 1 |
| 25 | 0 | 0 | 0 |
| 26 | 0 | 0 | 0 |
| 27 | 0 | 0 | 0 |
| 28 | 0 | 0 | 0 |
| 29 | 0 | 0 | 0 |
| 30 | 0 | 0 | 0 |
| 31 | 0 | 0 | 0 |

| BIT POSITION | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| LARGEST NON-COMPRESSED NUMBER 410 (1.0=>) | 0 | 0 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| ROUND NEAREST CONSTANT 520 | 0 | 0 | 0 | 0 | 0 | 0 | 0 | 0 | 1 | 1 | 1 | 0 | 0 | 0 | 1 | 1 | 1 | 0 | 0 | 0 | 0 | 0 | 0 | 0 | 0 | 0 | 0 | 0 | 0 | 0 | 0 | 0 |

SUBTRACT ROUND NEAREST CONSTANT 510 FROM LARGEST NON-COMPRESSED NUMBER 410 AS IF BOTH WERE BINARY NUMBERS:

| COMPRESSION BIAS CONSTANT 600 FOR ROUND NEAREST CASE | 0 | 0 | 1 | 1 | 1 | 1 | 1 | 1 | 0 | 0 | 1 | 1 | 1 | 1 | 0 | 0 | 1 | 0 | 0 | 0 | 0 | 0 | 0 | 0 | 0 | 0 | 0 | 0 | 0 | 0 | 0 | 0 |

440

| BIT POSITION | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| LARGEST NON-COMPRESSED NUMBER 410 1.0=> | 0 | 0 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| ROUND DOWN CONSTANT 510 | 0 | 0 | 0 | 0 | 0 | 0 | 0 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 |
| SUBTRACT ROUND DOWN CONSTANT 510 FROM LARGEST NON-COMPRESSED NUMBER 410 AS IF BOTH WERE BINARY NUMBERS: | | | | | | | | | | | | | | | | | | | | | | | | | | | | | | | | |
| 440 | 0 | 0 | 1 | 1 | 1 | 1 | 1 | 0 | 0 | 0 | 0 | 0 | 0 | 0 | 0 | 1 | 1 | 0 | 0 | 0 | 0 | 0 | 0 | 0 | 0 | 0 | 0 | 0 | 0 | 0 | 0 | 0 |
| DECOMPRESSION BIAS CONSTANT 700 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

FIG.7

| BIT POSITION | 31 | 30 | 29 | 28 | 27 | 26 | 25 | 24 | 23 | 22 | 21 | 20 | 2⁻1 | 2⁻2 | 2⁻3 | 2⁻4 | 2⁻5 | 2⁻6 | 2⁻7 | 2⁻8 | 2⁻9 | 2⁻10 | 2⁻11 | 2⁻12 | 2⁻13 | 2⁻14 | 2⁻15 | 2⁻16 | 2⁻17 | 2⁻18 | 2⁻19 | 2⁻20 |
|---|---|---|---|---|---|---|---|---|---|---|---|---|---|---|---|---|---|---|---|---|---|---|---|---|---|---|---|---|---|---|---|---|
| NON-COMPRESSED NUMBER<br>1200  0.75=> | 0 | 0 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| COMPRESSION BIAS CONSTANT<br>600 FOR ROUND NEAREST CASE | 0 | 0 | 1 | 0 | 1 | 1 | 0 | 1 | 1 | 1 | 0 | 0 | 1 | 0 | 0 | 0 | 0 | 0 | 0 | 0 | 0 | 0 | 0 | 0 | 0 | 0 | 0 | 0 | 0 | 0 | 0 | 0 |
| SUBTRACT COMPRESSION BIAS CONSTANT 600 FROM NON-COMPRESSED NUMBER 1200 AS IF BOTH WERE BINARY NUMBERS: | | | | | | | | | | | | | | | | | | | | | | | | | | | | | | | | |
| RESULT OF SUBTRACTION | 0 | 0 | 0 | 1 | 0 | 0 | 1 | 0 | 1 | 1 | 1 | 0 | 1 | 1 | 1 | 1 | 1 | 1 | 1 | 1 | 1 | 0 | 0 | 0 | 0 | 0 | 0 | 0 | 0 | 0 | 0 | 0 |
| RESULT OF EXTRACTION | | | | | | | | 1 | 0 | 1 | 1 | 0 | 1 | 1 | 1 | 1 | 1 | 1 | 1 | 1 | 1 | | | | | | | | | | | |
| COMPRESSED FLOATING POINT NUMBER REPRESENTATION<br>1000 | | | | | | | 0 | 1 | 1 | 0 | 1 | 0 | 1 | 1 | 1 | 1 | 1 | 1 | 1 | 1 | 1 | | | | | | | | | | | |

| BIT POSITION | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| COMPRESSED FLOATING POINT NUMBER REPRESENTATION 1000 | | | | | | | 0 | 1 | 1 | 0 | 1 | 1 | 1 | 1 | 1 | 1 | 1 | 1 | | | | | | | | | | | | | | |
| DECOMPRESSION BIAS CONSTANT 700 | 0 | 0 | 0 | 1 | 1 | 1 | 1 | 0 | 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |
| ADD DECOMPRESSION BIAS CONSTANT 700 TO COMPRESSED FLOATING POINT NUMBER REPRESENTATION 1000 AS IF BOTH WERE BINARY NUMBERS: | | | | | | | | | | | | | | | | | | | | | | | | | | | | | | | | |
| DECOMPRESSED FLOATING POINT NUMBER 1300 | 0 | 0 | 1 | 0 | 1 | 1 | 1 | 1 | 1 | 1 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |

FIG. 15

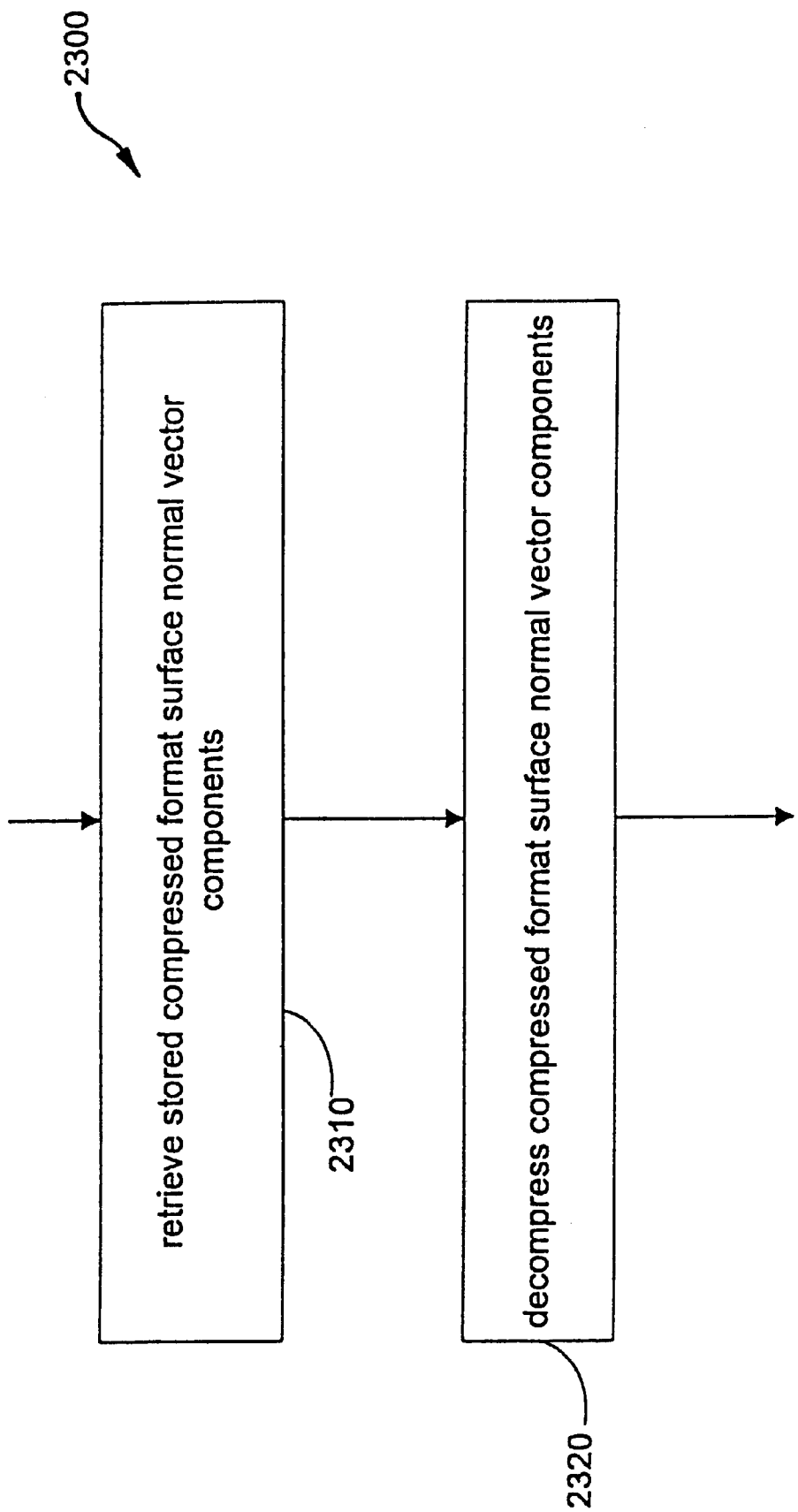

HIGH PERFORMANCE SURFACE NORMAL COMPRESSION

FIELD OF THE INVENTION

This invention relates generally to computer graphics and to the rendering of three dimensional images. More particularly, it relates to compression and decompression of surface normal data used in the rendering of three dimensional images.

BACKGROUND

For three dimensional images generated from abstract platonic primitives, such as lines and polygons, computer graphics applications and systems store primitive vertex information such as coordinates of surface points, associated surface normals, and other rendering information such as opacity, color, etc. Surface normals are vectors and as such are defined by a length and a direction. They can be represented in Cartesian coordinates by the coordinates {x,y,z} of a parallel vector of the same length whose starting point is the coordinate system origin.

This procedure for storing surface normals as a set of three floating point numbers introduces several problems. First, floating-point number representations of Cartesian coordinates often provide more precision than needed for realistic visual representation resulting in inefficient use of the resources of memory and computation time. Second, storing a surface normal as an {x,y,z} Cartesian vector does not guarantee that the surface normal is of unit length, i.e. the distance from the origin to the point {x,y,z} is one. Graphics libraries in common use expect to receive surface normal data in unit length and must scale the length of the surface normals to one, if they are not received as such. And third, using common single precision floating point formats, the total space required to store a surface normal is three 32-bit full words, or 12 bytes. When several hundred thousand surface normals need to be stored, along with other geometric and application data, upper bounds on system memory resources can be reached. This inefficient use of memory limits the maximum size and resolution of the image that can be rendered at any given time.

A common technique used to address the above problems is to represent and store surface normals as spherical coordinates instead of Cartesian coordinates. Using this technique two floating point values are specified, one for the longitude or polar angle and one for the latitude or azimuthal angle, which results in a 3:2 data compression ratio for the unit length surface normal. Required memory could be reduced further, with reduced precision, by storing the latitude and longitude as two short integers, each of which requires 2 bytes of memory in common systems, for a total of 4 bytes, resulting in a 3:1 data compression ratio. However, the numeric precision is not uniform between the two coordinate values of longitude and latitude. If the normal position is near latitude π/2 or −π/2 (i.e., near the poles), the longitude value provides much greater precision than when the latitude is near 0 (i.e., near the equator). Also, conversion from spherical coordinates to Cartesian coordinates for graphics processing is computationally expensive.

Another technique for storing the unit length surface normals is to use an abstract single number representation. This technique involves a tessellation of a sphere obtained by combining the vertices of two platonic solids, the icosahedron and the dodecahedron. Then, a 4-deep triangle subdivision of the resulting 60 equilateral triangles is performed giving a sphere covered with 7680 triangles. A surface normal is mapped into an abstract value by first determining which of the original 60 triangles contains the normal. Then 128 dot products with the normal to the 128 interior triangles are performed. The largest dot product indicates the best matching triangle for the incoming normal. The result of these computations is used as the compressed normal. To decompress, the compressed normal is used to index a table of pre-computed values. Calculation of the numerous dot products required in this technique is computationally inefficient. Higher resolution, i.e., more and smaller triangles, results in even more involved computations. Much of the memory savings inherent in this technique is lost because of the size of the lookup table. Also, the range of compressed normals is limited by the size of the decompression table which puts an upper limit on their precision. This technique is often used to map normals to pre-computed lighting values using a lookup table as above with the lighting values instead of normals. Used in this manner, when the lighting direction to the model is changed, the values in the look-up table must be recomputed, resulting in additional computation time. Because a lighting look-up table is used, this algorithm does not address the issue of scaling the original surface normal coordinates for unit length, and thus is not a data compression technique in the purest sense.

Still another method uses an abstract single number as an index into a table of surface normals based on the tessellation of a unit sphere. Because of the symmetry of the unit sphere, the table size can be reduced by dividing the unit sphere into identical octants bounded by the x=0, y=0, and z=0 planes. This division results in a triangular shaped area which is further folded into identical sextants bounded by the x=y, y=z, and x=z planes. The resulting table size is reduced by a factor of 48.

In a further refinement of the previous method, the normal is encoded as two orthogonal angular addresses. This coding technique allows selection of the resolution of the surface normal by increasing or reducing the number of bits in each angular address. Further reduction of normal size is possible by encoding the normal index using a variable length delta-encoding where only the difference between adjacent normals is encoded. This technique can reduce the size of an encoded normal by half.

Such methods result in high compression, but are computationally expensive to compress and decompress. In addition, employing an index into a table consumes a large amount of memory in storing the table and incurs a performance penalty in accessing values from the table. Also, encoding the surface normal as two orthogonal angular addresses introduces data alignment issues which slow memory access and require special code to access and align the data for processing. And, using delta encoding makes rendering an arbitrary geometry from compressed data and error recovery very difficult.

Therefore, in order to better meet the dual requirements of reduced memory utilization which permits more geometry to be loaded into memory and of higher speed which increases rendering performance, a need exists for further improvements in compression methods used in storing surface normal data for use in rendering three dimensional images.

SUMMARY OF THE INVENTION

Representative embodiments of the present invention relate to methods for the high performance compression of surface normals. In a representative embodiment of the methods for compression of a surface normal, if not already of unit length, the surface normal is first scaled to unit length in Cartesian coordinates. Scaling the surface normal to unit length is not required, however surface normal component values must be in the specified range of floating point values. Expressed in floating point number format, each of the three Cartesian vector components of the surface normal are biased by the subtraction of a constant. The subtractions are performed as if all values are binary numbers, referred to herein as fixed-point-format binary numbers. A specified number of bits is extracted from each result and stored as the compressed representation of that vector component. Decompression occurs in a similar, but reverse process.

The present patent document discloses methods for the high speed compression and decompression of limited range floating point numbers which are used to compress and decompress the vector components of surface normals. Compression of a floating point number converts it to a much smaller representation of the number, and decompression converts a compressed representation of a floating point number back into a regular floating point number whose value is approximately that of the original floating point number, but may have somewhat less precision.

In a representative embodiment, the three vector components could be stored in a four byte memory space. The compressed representation of each vector component occupies 10 bits with one of the 10 bits storing the sign bit and nine storing the compressed representation of the vector component's magnitude. In this scheme two bits of the four bytes are unoccupied.

Methods used in the present patent document are designed for rapid execution on a computer. For compression, these methods employ the very fast numerical steps of subtraction, extraction, and insertion. While for decompression, these methods employ comparably fast numerical steps of addition, extraction, and insertion.

In a representative embodiment, prior to compression and decompression, six characteristics should be either specified or determined: (1) the number of binary digits used in the compressed representation, (2) whether or not decompression results have mixed signed values, (3) whether or not decompression results include zero, (4) the largest non-compressed absolute value, (5) the smallest, non-zero non-compressed absolute value, and (6) the compression rounding method. In representative embodiments there are three compression rounding methods: (1) "Round down", (2) "Round to Nearest", and (3) "Round up". The range of numbers to be compressed, referred to herein as the range of compressible numbers, is also specified.

The non-compressed number space and the compressed number space both comprise discrete values with the compressed number space having a lesser precision than the non-compressed number space. Decompressions of compressed numbers return discrete decompressed values in the non-compressed number space . In the "round down" compression rounding method any value in non-compressed number space between two such adjacent decompressed values is rounded down in compressed number space to the smaller or "floor" of the two corresponding adjacent compressed values. In the "round up" compression rounding method any value in non-compressed number space between two such adjacent decompressed values is rounded in compressed number space to the larger or "ceiling" of the two corresponding adjacent compressed values. While, in the "round nearest" compression rounding method any value in non-compressed number space between two such adjacent decompressed values is rounded in compressed number space to the nearest of the two corresponding adjacent compressed values.

Using these six characteristics, constants used in the compression/decompression process, as well as the resulting precision, can be determined.

The floating-point compression process begins by clearing the sign bit to zero. However, if decompression results have mixed signed values as surface normals in graphics applications normally have, the sign bit is extracted and stored before clearing. Next the compression bias constant, computed in accordance with the teachings of the present patent document, is subtracted from the modified floating-point value. The subtraction is performed as if both values are binary numbers. Such values are referred to herein as fixed-point-format binary numbers. The determined number of bits is extracted from the result and is stored in the compressed floating-point number. When the result of the subtraction is less than or equal to zero, zero is stored. Finally, the saved floating-point sign bit is stored in the compressed floating-point number.

To decompress, the compressed floating-point value is deposited into a floating-point value. When the compressed floating-point number is zero, the decompression process is complete. Otherwise, the decompression bias constant, computed in accordance with the teachings of the present patent document, is added to this value as if both values are binary numbers. Finally, the compressed floating-point sign bit is stored in the floating-point sign.

Compressed surface normals obtained using methods of a representative embodiment enable graphics applications to display larger geometry data sets with higher performance than would otherwise be possible without compression. The methods used in the representative embodiments are simple and fast. They can be implemented in graphics hardware with minimal cost and complexity and with full graphics performance. Other aspects and advantages of the present invention will become apparent from the following detailed description, taken in conjunction with the accompanying drawings, illustrating by way of example the principles of the invention. The details disclosed in the specification should not be read so as to limit the invention.

BRIEF DESCRIPTION OF THE DRAWINGS

The accompanying drawings provide visual representations which will be used more fully describe the invention and can be used by those skilled in the art to better understand it and its inherent advantages. In these drawings, like reference numerals identify corresponding elements.

FIG. 4 is a bit map of numbers for an illustrative example of an extraction or insertion bit position for a representative embodiment.

FIG. 5 is a bit map of compression rounding constants for an illustrative example of a representative embodiment.

FIG. 6 is a bit map showing subtraction of the round nearest constant from the largest non-compress number to obtain a compression bias constant in an illustrative example of a representative embodiment.

FIG. 7 is a bit map showing subtraction of the round down constant from the largest non-compress number to obtain a decompression bias constant in an illustrative example of a representative embodiment.

FIG. 12 is a bit map of an illustrative numerical example in which a floating point number is compressed according to a representative embodiment.

FIG. 15 is a bit map of an illustrative numerical example in which a compressed number is decompressed into a floating point number according to a representative embodiment.

FIG. 23 is a flow chart of a computer program for decompressing a compressed surface normal according to a representative embodiment.

FIG. 24 is a schematic drawing of a data structure used in a representative embodiment.

DETAILED DESCRIPTION OF THE PREFERRED EMBODIMENTS

1. Introduction

Figure 1:
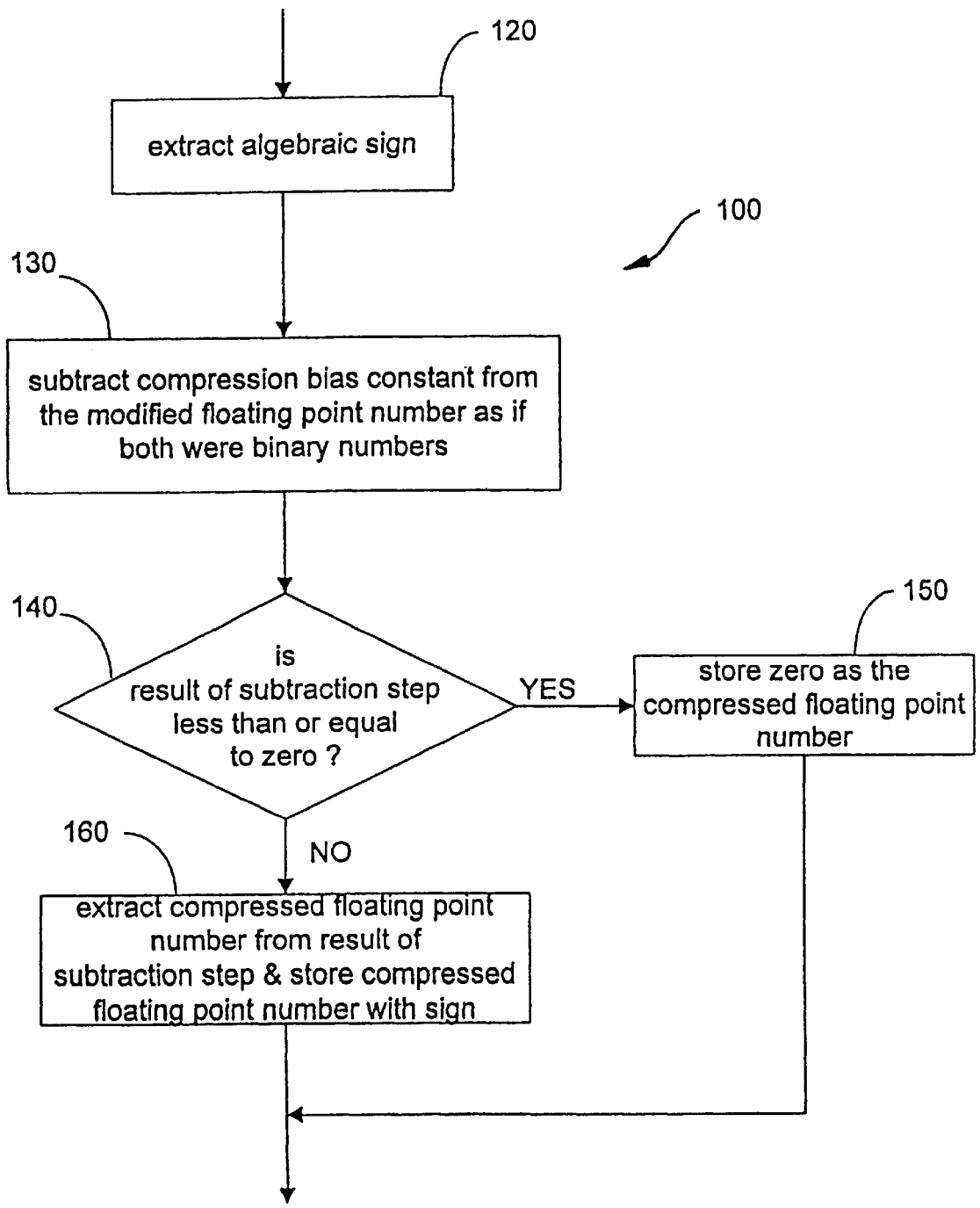
FIG. 1 is a flow chart of an overview of a computer program for compressing a floating point number according to a representative embodiment.

As shown in the drawings for purposes of illustration, the present invention relates to a method of compression of surface normal data used in the rendering of three dimensional images. As an intermediate step in a representative embodiment, unit length surface normal data is stored in compressed format and then decompressed for use in rendering three dimensional images on the screen of a computer, a printer, or other appropriate device. A representative embodiment provides a memory and computational efficient method of compressing surface normals of three dimensional images. In the following detailed description and in the several figures of the drawings, like elements are identified with like reference numerals.

In a representative embodiment of the methods for compression of a surface normal, the vector components of the surface normal are first expressed in floating point format and then compressed. When required for rendering of a three dimensional image, the compressed representations of each vector component are decompressed into floating point format.

In representative embodiments, section 2.0 and its sub-sections describe methods used for compression and decompression of floating point format numbers. Subsequent sections more fully describe the rendering of three dimensional images and the compression/decompression of surface normal data.

2.0 Compression/Decompression Methods for Floating Point Format Numbers

This section and associated sub-sections describe methods for compressing floating point format numbers into compressed representations and the reverse process of decompressing compressed representations into non-compressed floating point format numbers.

2.1 Introduction to the Methods for Compression/Decompression of Floating Point Format Numbers As shown in the drawings for purposes of illustration, the present patent document uses methods for the high speed compression and decompression of limited range floating point numbers. Methods used for compression and decompression of floating point numbers always trade off reduction in memory required vs. speed. Methods used in the present patent document are designed for rapid execution on a computer. In the following detailed description and in the several figures of the drawings, like elements are identified with like reference numerals.

Compression of floating point numbers is useful for reducing the storage space in computer memory required for either floating point data or any data structures which contain floating point numbers. Compression is also useful for reducing the bandwidth or speed required of a communication pathway to transmit either floating point data or any data structures which contain floating point numbers. Compressed floating point numbers may be used directly as data, without decompressing them. Specifically, the compressed floating point number, if interpreted as an integer, may be used for data lookup, such as an index into an array. Used as such, it constitutes a rapid method of mapping floating point numbers to values stored in the array.

2.2 Overview of the Methods

Sections 2.1 and 2.2 provide brief overviews of representative embodiments for the methods of compression and decompression of floating point numbers. Subsequent sections provide greater detail for these methods.

Prior to compression of a floating point number and related decompression of a compressed representation of the floating point number, several constants need to be computed. Among these constants are a compression bias constant, an extraction bit position, an extraction field which is a field of contiguous bits, and a decompression bias constant. These constants are required for both compression and decompression. They need only be computed once and then stored for future use.

2.2.1 Overview of Compression

FIG. 1 is a flow chart of a compression software program 100 in which an overview of the method steps of a representative embodiment for the compression of a floating point number are shown. More detail will be provided in the discussion and figures that follow.

When algebraic signs are to be retained as a part of the compressed floating point number, block 120 extracts the value of the floating point sign bit. Block 120 then transfers control to block 130.

Block 130 subtracts the compression bias constant from the floating point number. The subtraction is performed as if both the floating point number and the compression bias constant were binary numbers. Block 130 then transfers control to block 140.

When the result of the subtraction is less than or equal to zero, block 140 transfers control to block 150. Otherwise block 140 transfers control to block 160.

Block 150 stores zero as the compressed floating point number. Block 150 then terminates the software program.

Block 160 uses the extraction bit position and the extraction field in extracting a bit field from the result of the subtraction step for storage in the compressed floating point number. When the algebraic sign of the floating point number is to be stored, block 160 performs that storage. Block 150 then terminates the software program.

2.2.2 Overview of Decompression

Figure 2:
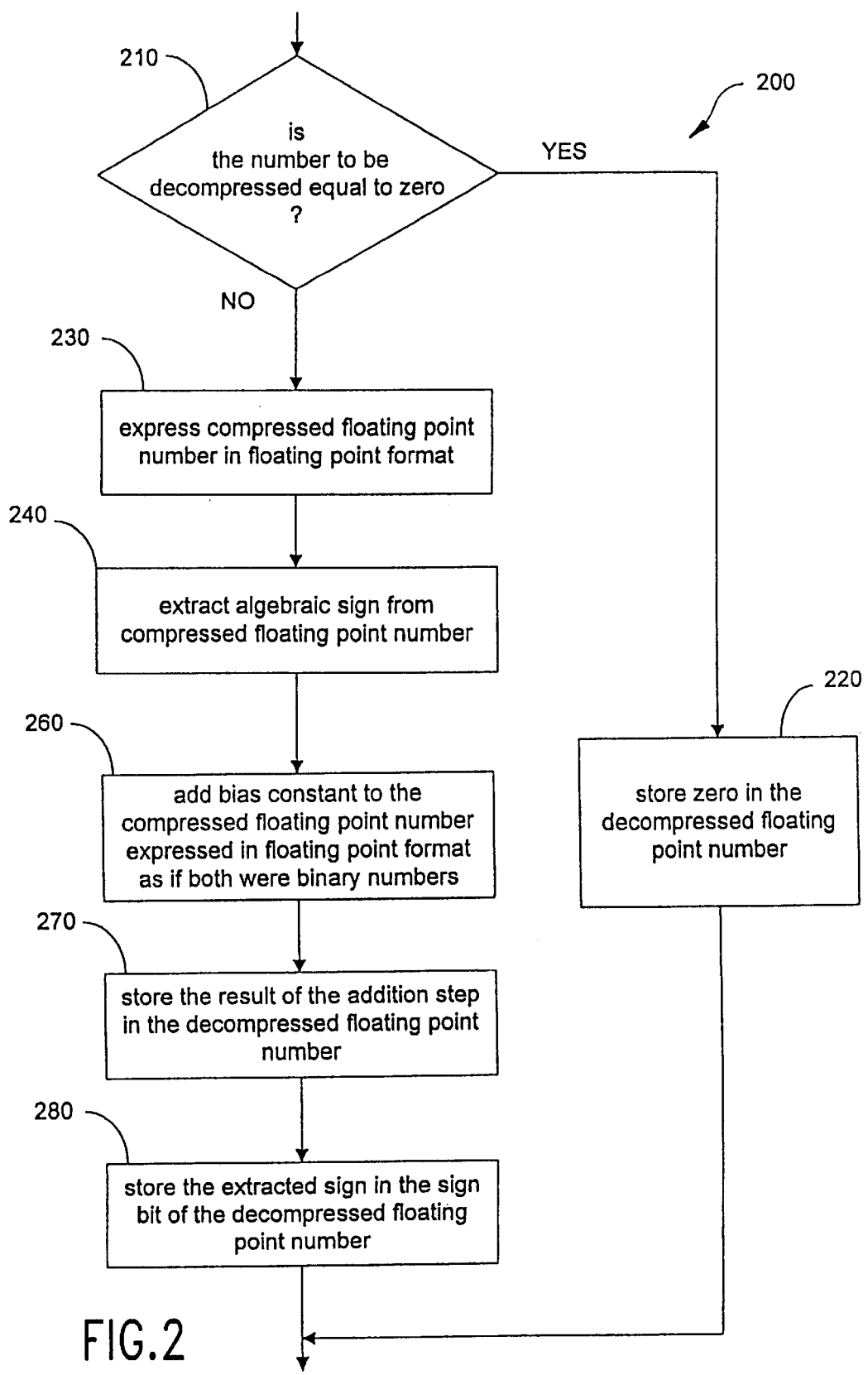
FIG. 2 is a flow chart of an overview of a computer program for decompressing a floating point number according to a representative embodiment.

FIG. 2 is a flow chart of a decompression software program 200 in which an overview of the method steps of a representative embodiment for the decompression of a compressed representation of a floating point number are shown. More detail will be provided in the discussion and figures that follow.

When the number to be decompressed is zero, block 210 of FIG. 2 transfers control to block 220. Otherwise, block 210 transfers control to block 230.

Block 220 stores zero in the decompressed floating point number. Block 220 then terminates the software program.

Block 230 expresses the compressed floating point number in floating point format. Block 230 then transfers control to block 240.

When algebraic signs are retained as a part of the compressed floating point number, block 240 extracts the value of the floating point sign bit from the compressed floating point number. Block 240 then transfers control to block 260.

Block 260 adds the decompression bias constant to the compressed floating point number expressed in floating point format. The addition is performed as if both the compressed floating point number expressed in floating point format and the decompression bias constant were binary numbers. Block 260 then transfers control to block 270.

Block 270 stores the result of the addition step in the decompressed floating point number. Block 270 then transfers control to block 280.

When algebraic signs are retained as a part of the compressed floating point number, block 280 stores the extracted algebraic sign in the sign bit of the decompressed floating point number. Block 280 then terminates the software program 2.3 Floating Point Format The conventional representation, as specified by the IEEE 754 standard, for a fixed point number in computer systems will be used in the present patent document to point out the features of representative embodiments. However, this floating point number representation is used for illustrative purposes only. The method of compression/decompression is not limited to this particular representation.

Figure 3:
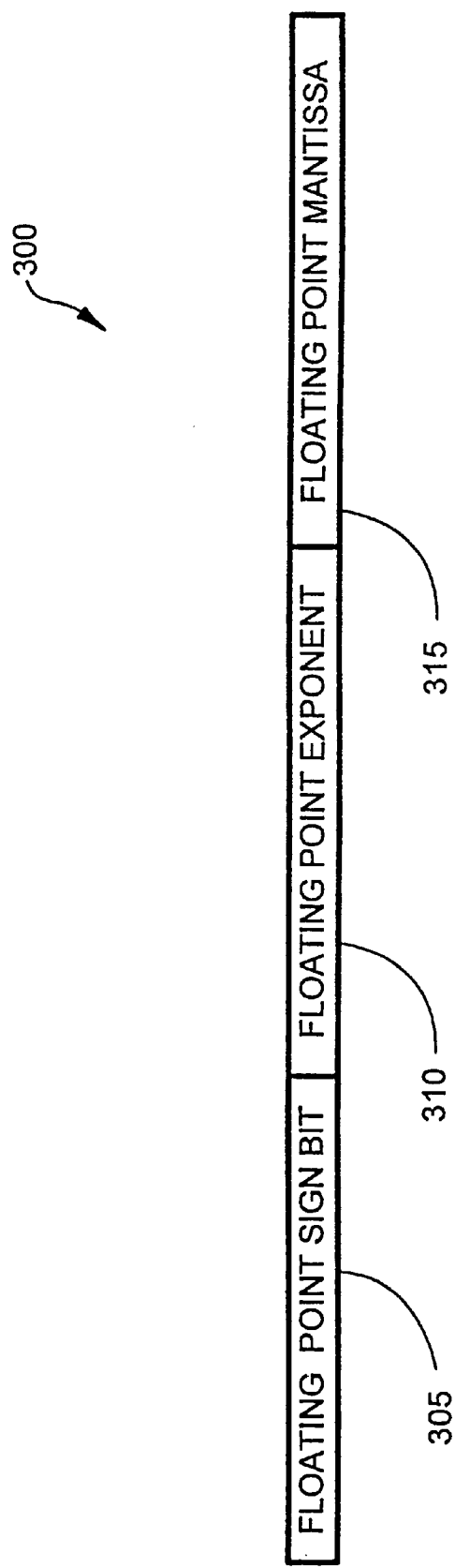
FIG. 3 is a drawing of a segment of computer memory for storing a floating point number.

FIG. 3 shows in single precision format a floating-point-format number 300, also referred to herein as a floating point number 300, as defined in the IEEE 754 standard. The floating point number 300 occupies 32-bits divided into a floating point sign bit 305, eight (8) bits for a floating point exponent 310, and 23 bits for a floating point mantissa 315. To construct the floating-point-format number 300 of a fixed point number, first the whole and fractional parts of the fixed point number are separately converted to binary numbers and combined while maintaining the location of the decimal point. The leading "1" of the binary number is then placed to the left of the decimal point and the binary number is multiplied by the appropriate exponent. In order to store only positive values in the floating point exponent 310, the integer 127 is added to the value of the floating point exponent 310. Only the fractional part of the mantissa is stored in the floating point mantissa 315, as the leading "1" of the binary representation is always present except when the number is zero, in which case the binary number consists of all zeros.

2.4 Compression and Decompression Setup

In a representative embodiment, prior to compression and decompression, six characteristics are either specified or determined: (1) the number of binary digits used in the compressed representation, (2) whether or not decompression results have mixed signed values, (3) whether or not decompression results include zero, (4) the largest non-compressed absolute value, (5) the smallest, non-zero non-compressed absolute value, (6) the compression rounding method used. In representative embodiments there are three compression rounding methods: (1) "Round down", (2) "Round to Nearest", and (3) "Round up". The range of numbers to be compressed, referred to herein as the range of compressible numbers, is also specified.

The three compression rounding methods indicated above are explained in detail in section 2.4.7.

2.4.1 Compressed representation size

The number of binary digits in the compressed representation directly controls the precision of the compressed floating-point value. Selecting smaller number of digits increases value compression while larger number of digits provides increased precision. In an illustrative example, 9 digits of value have been chosen.

2.4.2 Decompression sign

If the decompressed values include mixed signs, wherein the decompressed numbers include both positive and negative values, then an additional sign bit is allocated in the compressed number. When decompressed values are of the same sign, the sign may be added as a constant to the value during the decompression step. For the example, mixed sign values will be used. As such, the total number of binary digits in the compressed representation is 10.

2.4.3 Decompression of zero

Zero in the decompression values is handled differently from other values. When the compressed representation is zero, the decompressed value is also zero and the decompression algorithm is not used. When, however, zero is not in the decompression range, the test for zero can be eliminated. For the representative implementation, zero will be in the decompressed range.

2.4.4 Largest non-compressed number

The largest non-compressed number is the largest absolute value to be compressed. This number is used in determining the compression and decompression bias constants. The largest number returned from decompression is also this number. For the representative example, 1.0 is the largest non-compressed number.

2.4.5 Smallest, non-zero non-compressed number

The smallest, non-zero non-compressed number is a number selected by the user to be the smallest, non-zero absolute value that will be compressed. It is used in computing the compression and decompression bias constants. Due to the loss of precision in the compression/decompression processes the value recovered from decompression will only approximate that which was compressed. The actual value recovered is also dependent upon the compression rounding method chosen. To maximize precision while also maximizing compression, the smallest, non-zero non-compressed number should be chosen to be as close to the largest compressed representation as possible.

2.4.6 Extraction constant

FIG. 4 is a bit map of numbers for the illustrative example. The top line of FIG. 4 indicates the bit position of the floating point numbers shown below the top line. The second line is the floating point representation of a largest non-compressed number 410, also referred to herein as a largest non-compressed absolute value 410, which for the illustrative example is fixed point 1.0 and treated as a binary number is 0x3F800000. The third line is the floating point representation of a smallest, non-zero non-compressed number 420, also referred to herein as a smallest, non-zero non-compressed absolute value 420, which for the illustrative example is fixed point 0.064 and treated as a binary number is 0x3D851EB8. The fourth line is a subtraction result 430, also referred to as a difference value 430, which for the illustrative example has a binary value of 0x1FAE148. The position of the highest non-zero bit resulting from the subtraction of the smallest, non-zero non-compressed number 420 from the largest non-compressed number 410 as if both values are binary numbers is an extraction bit position 440, also referred to herein as an insertion bit position 440. In the illustrative example, the extraction bit position 440 is 0x1000000 or bit position 24. Also shown is a compressed representation field size 450 which for the illustrative example is 9 bits. Since the compressed representation field size 450 is 9 bits, the compressed representation field size 450 aligned with the extraction bit position 440 is 0x1FF0000. An extraction field 460 which results from the subtraction is shown in line five. Line five consists of one's beginning in the extraction bit position 440 and extending to the right for the compressed representation field size 450. In the illustrative example, these bits are extracted from non-compressed numbers to construct the corresponding compressed representations.

2.4.7 Compression rounding method

Finally, the compression rounding method should be chosen. The non-compressed number space and the compressed number space both comprise discrete values with the compressed number space having a lesser precision than the non-compressed number space. Decompressions of compressed numbers return discrete decompressed values in the non-compressed number space. In the "round down" compression rounding method any value in non-compressed number space between two such adjacent compressed values is rounded down in compressed number space to the smaller or "floor" of the two corresponding adjacent compressed representations. In the "round up" compression rounding method any value in non-compressed number space between two such adjacent compressed values is rounded in compressed number space to the larger or "ceiling" of the two corresponding adjacent compressed representations. While, in the "round nearest" compression rounding method any value in non-compressed number space between two such adjacent compressed values is rounded in compressed number space to the nearest of the two corresponding adjacent compressed representations. The rounding method has no performance impact on compression or decompression.

FIG. 5 is a bit map of compression rounding constants for the illustrative example. In the example, a compression rounding constant 500 is obtained by one of three compression rounding methods: (1) the "round down" method obtains a round down constant 510 in which the value to be compressed is rounded down to a compressed representation in the compression domain, (2) the "round nearest" method obtains a round nearest constant 520 in which the value to be compressed is rounded to the nearest value available in the compression domain, and (3) the "round up" method obtains a round up constant 530 in which the value to be compressed is rounded up a compressed representation in the compression domain.

For the "round nearest" method, the compression rounding constant 500 is the round nearest constant 520 which is the extraction bit position 440 filled to the right with ones for the compressed representation field size 450 plus one. For the "round down" method, the compression rounding constant 500 is the round down constant 510 which is the extraction bit position 440 filled to the right with ones for the compressed representation field size 450. For the "round up" method, the compression rounding constant 500 is the round up constant 530 which is the extraction bit position 440 filled to the right with ones to the end.

The construction and use other compression rounding constants 500 is also possible. In particular, any value between that of the round down constant 510 and that of the round up constant 530 could be used.

2.4.8 Compression and decompression bias constants

In the illustrative example, FIG. 6 is a bit map showing subtraction, as binary numbers, of the compression rounding constant 500, which for the illustrative example is the round nearest constant 520, from the largest non-compressed number 410. The result of this subtraction is a compression bias constant 600. The compression rounding constant 500 used in this step is based upon the rounding method specified.

As an example, for the illustrative example, using the "round nearest" method, the round nearest constant 520 has one plus the number of bits in the extraction field 460, in this example 10 bits, filled with ones beginning at the extraction bit position 440 and extending toward the least significant bit, or 0xIFF8000. Subtracting this value from the largest non-compressed number as binary numbers gives a compression bias constant 600 of 0x3D808000 (0x3F800000–0x1FF8000=0x3D808000).

In the example, FIG. 7 is a bit map showing subtraction, as binary numbers, of the compression rounding constant 500, which is the round down constant 510, from the largest non-compressed number 410. The result of this subtraction is a decompression bias constant 700. To obtain the decompression bias constant 700, the subtraction always uses the round down constant 510. For this illustrative example, the decompression rounding constant 500 has the number of bits in the extraction field 460, in this example 9 bits, filled with ones beginning at the extraction bit position 440 and extending toward the least significant bit, or 0x1FF0000. Subtracting this value from the largest non-compressed number 410 as binary numbers gives a decompression bias constant 700 of 0x3D810000.

Figure 8:
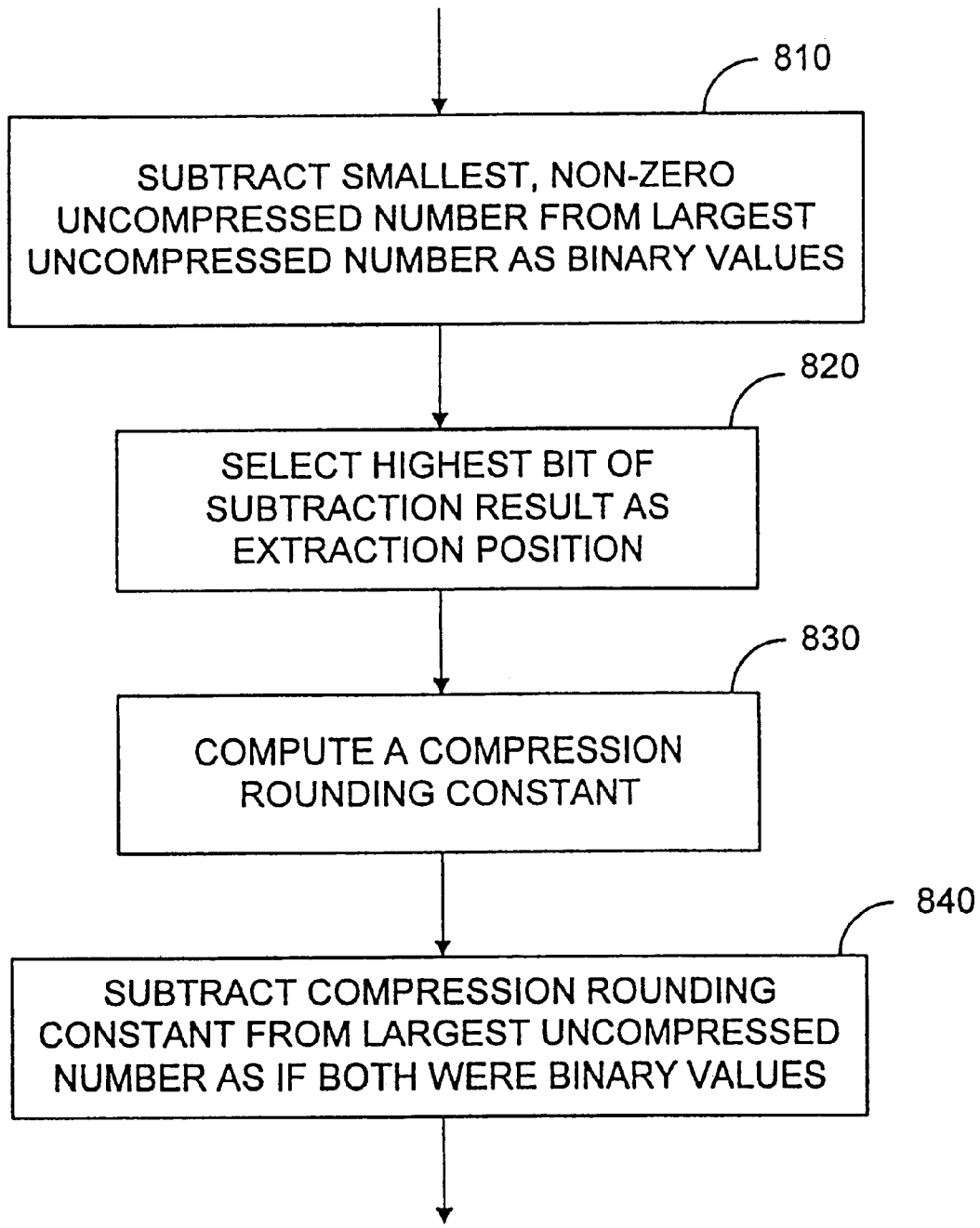
FIG. 8 is a flow chart of the method used to compute the compression bias constant in a representative embodiment.

2.4.9 Review of steps for computing compression and decompression bias constants Refer to FIG. 8 for a flow chart of the method used to compute the compression bias constant 600 in a representative embodiment.

Block 810 subtracts the smallest, non-zero non-compressed number 420 from the largest non-compressed number 410 as if both numbers were binary numbers. Block 810 then transfers control to block 820.

Block 820 selects the highest bit of the result of the subtraction step as the extraction bit position 440. Block 820 then transfers control to block 830.

Block 830 computes the compression rounding constant 500 based upon whether the "round down", "round nearest", or "round up" method has been chosen. Block 830 then transfers control to block 840.

Block 840 subtracts the compression rounding constant 500 from the largest non-compressed number 410 as if both numbers were binary numbers to obtain the compression bias constant 600.

Figure 9:
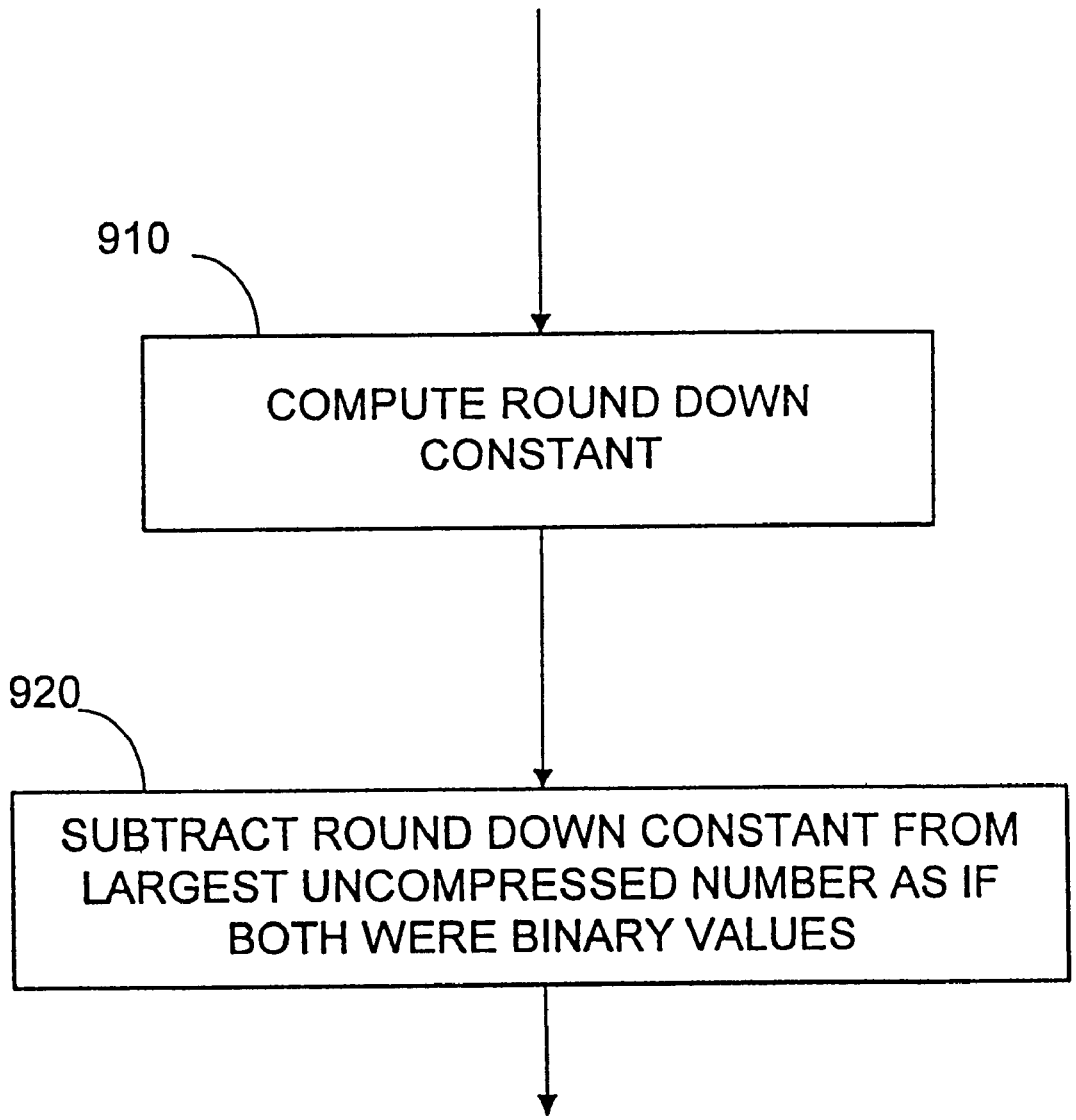
FIG. 9 is a flow chart of the method used to compute the decompression bias constant in a representative embodiment.

Refer to FIG. 9 for a flow chart of the method used to compute the decompression bias constant 700 in a representative embodiment.

Using the extraction bit position 440 previously obtained, block 910 computes the round down constant 510. Block 910 then transfers control to block 920.

Block 920 subtracts the round down constant 510 from the largest non-compressed number 410 as if both numbers were binary numbers to obtain the decompression bias constant 700.

2.5 Compression

Figure 10:
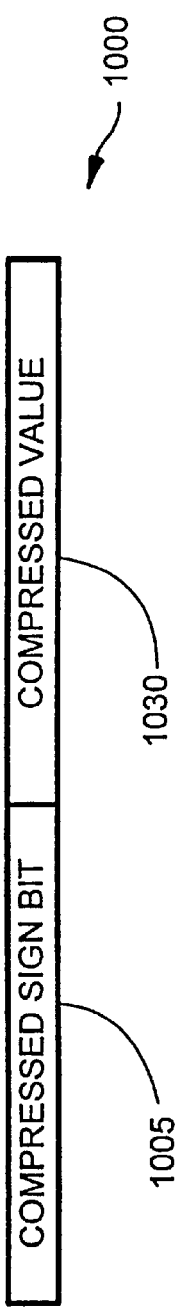
FIG. 10 is a drawing of a segment of computer memory for storing a compressed floating point number.

FIG. 10 is a drawing of a segment of memory for a compressed floating point number representation 1000, also referred to herein as a compressed floating point number 1000, of the floating point number which, as an example, could be stored in computer memory as indicated by the floating-point-format number 300 of FIG. 3. In the illustrative example, the compressed floating point number 1000 occupies 10-bits divided into a compressed sign bit 1005 and nine bits for a compressed representation 1030.

Figure 11:
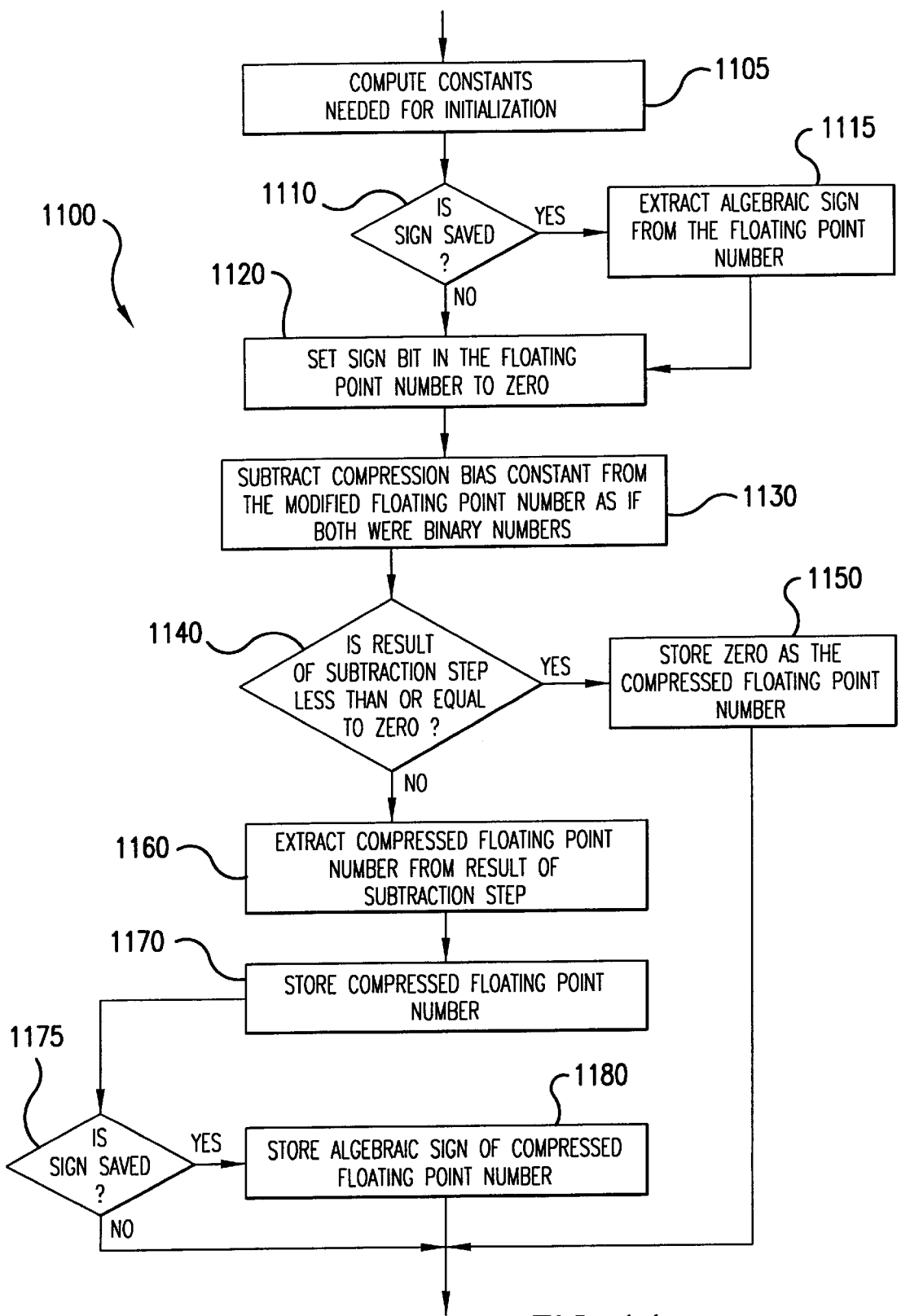
FIG. 11 is a flow chart of a computer program for compressing a floating point number according to a representative embodiment.

FIG. 11 is a flow chart of a compression software program 1100 in which the method steps of a representative embodiment for the compression of a floating point number are shown. Block 1105 of FIG. 11 performs the computations previously described to obtain values for the extraction bit position 440, the compression rounding constant 500, the round down constant 510 when needed, the round nearest constant 520 when needed, the round up constant 530 when needed, and the compression bias constant 600. Block 1105 then transfers control to block 1110.

When the sign of the floating point number is to be saved, block 1110 transfers control to block 1115. Otherwise, block 1115 transfers control to block 1120.

Block 1115 extracts the value of the floating point sign bit 305 from the floating-point-format number 300. Block 1115 then transfers control to block 1120.

Block 1120 sets the floating point sign bit 305 to zero. Block 1120 then transfers control to block 1130.

Referring to both FIG. 11 and FIG. 6, Block 1130 subtracts the compression bias constant 600 from the floating-point-format number 300 as modified in block 1120.

This subtraction step involves treating both the compression bias constant 600 and the floating-point-format number 300 both as pure binary numbers, ignoring any distinction between the sign bits, exponents, and mantissas. Block 1130 transfers control to block 1140. When the result of the subtraction step of block 1130 is less than or equal to zero, block 1140 transfers control to block 1150. Otherwise, block 1130 transfers control to block 1160.

Block 1150 stores zero in the compressed floating point number 1000. Block 1150 then terminates the compression software program 1100.

Block 1160 extracts the compressed representation 1030 from the result of the subtraction of block 1130 which for the illustrative example is the 9 bits including and just to the right of the extraction point 440. Block 1160 then transfers control to block 1170.

Block 1170 stores the value of the compressed representation 1030 extracted in block 1160 in the compressed floating point number 1000. Block 1170 then transfers control to block 1175.

When the algebraic sign of the floating-point-format number 300 is to be saved, block 1175 transfers control to block 1180. Otherwise, block 1175 terminates the compression software program 1100.

Block 1180 stores the value of the floating point sign bit 305, extracted in block 1115, in the compressed sign bit 1005 of the compressed floating point number 1000. Block 1180 then terminates the compression software program 1100.

FIG. 12 is a bit map of an illustrative numerical example in which a floating point number is compressed according to a representative embodiment. In this figure, the compression bias constant 600 for the round nearest case is subtracted from the non-compressed number 1200 which has a decimal value of 0.75. For the illustrative example, the 9 bits just to the right of and including the extraction point 440 are extracted and stored in the compressed representation 1030 of the compressed floating point number 1000 and the compressed sign bit 1005 is set.

2.6 Decompression

Figure 13:
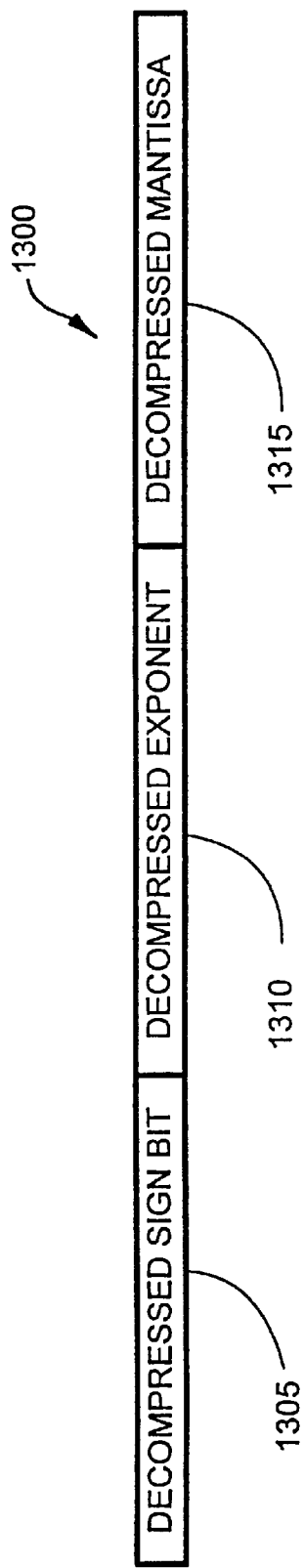
FIG. 13 is a drawing of a segment of computer memory for storing a decompressed floating point number.

FIG. 13 is a drawing of a segment of memory for storing a decompressed-floating-point-format number 1300, also referred to herein as a decompressed floating point number 1300, of the value of the floating-point-format number 300 of FIG. 3. In a representative embodiment, the decompressed floating point representation 1300 occupies memory space equivalent to that of the floating-point-format number 300 which in the example is 32-bits divided into a decompressed sign bit 1305, eight (8) bits for a decompressed exponent 1310, and 23 bits for a decompressed mantissa 1315.

Figure 14:
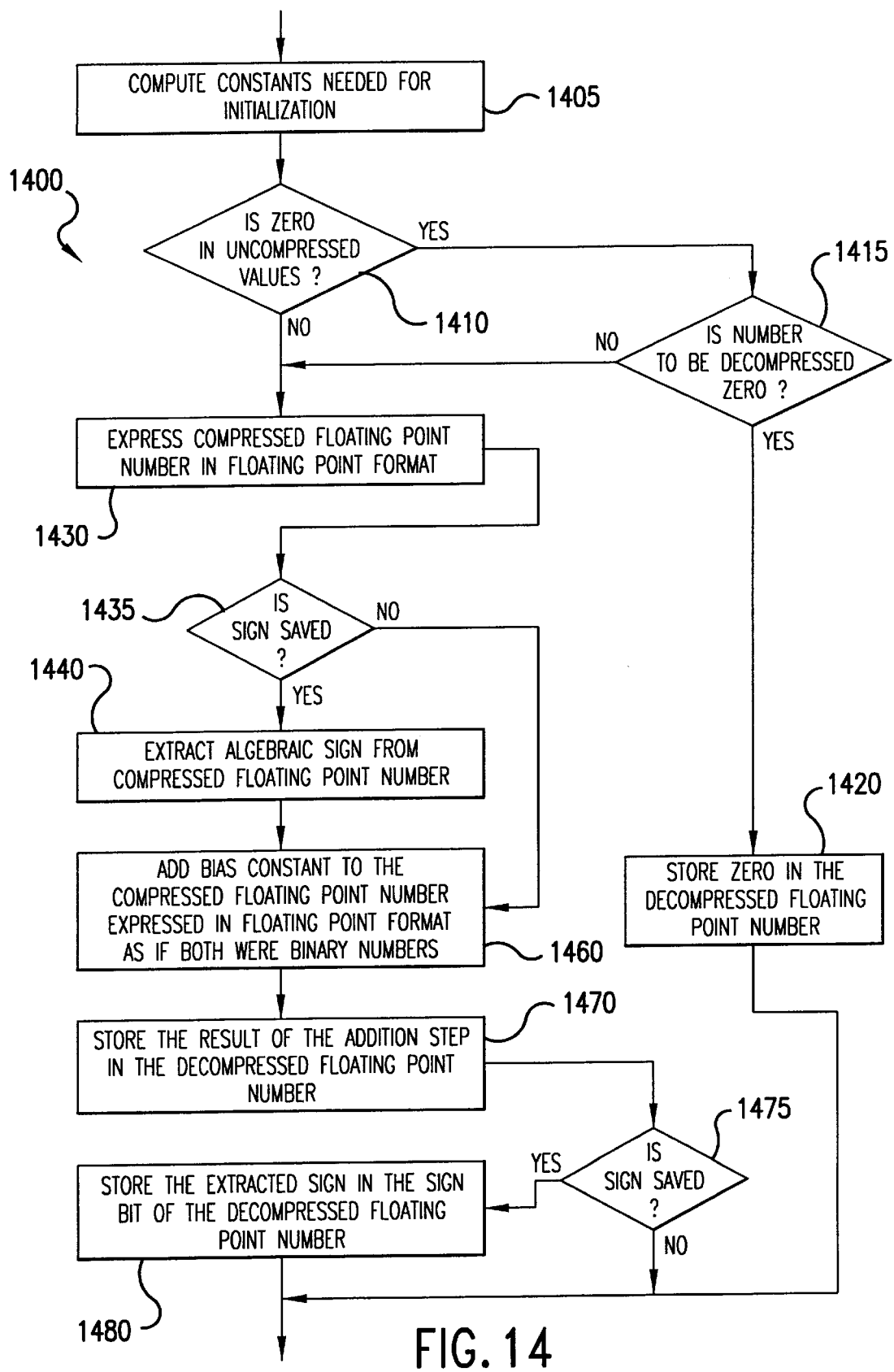
FIG. 14 is a flow chart of a computer program for decompressing a compressed representation of a floating point number according to a representative embodiment.

FIG. 14 is a flow chart of a decompression software program 1400 in which the method steps of a representative embodiment for the decompression of a compressed representation of a floating point number are shown.

Block 1405 of FIG. 14 performs the computations previously described to obtain values for the extraction bit position 440, the compression rounding constant 500, the round down constant 510, and the decompression bias constant 700. Block 1405 then transfers control to block 1410.

When the value zero can be a value of the decompressed floating point number 1300, block 1410 transfers control to block 1415. Otherwise, block 1410 transfers control to block 1430.

When the compressed floating point number 1000 is equal to zero, block 1415 transfers control to block 1420. Otherwise, block 1415 transfers control to block 1430.

Block 1420 stores a zero in the decompressed floating point number 1300 and terminates the decompression software program 1400.

Block 1430 expresses the compressed floating point number 1000 in the decompressed floating point number 1300 by copying the compressed representation 1030 into the decompressed floating point representation 1300 at and to the right of the insertion point 440. All other bits in the decompressed floating point number 1300 are set to zero. Block 1430 then transfers control to block 1435.

If the floating point sign bit 305 of the floating-point-format number 300 was saved in the compressed sign bit 1005, block 1435 transfers control to block 1440. Otherwise, block 1435 transfers control to block 1460.

Block 1440 extract the compressed sign bit 1005 from the compressed floating point number 1000. Block 1440 then transfers control to block 1460.

Block 1460 adds the decompression bias constant 700 to the compressed floating point number 1000 expressed in floating point format as if both were binary numbers. Block 1460 then transfers control to block 1470.

Block 1470 stores the result of the addition of block 1460 in the decompressed floating point number 1300. Block 1470 then transfers control to block 1475.

If the floating point sign bit 305 of the floating-point-format number 300 was saved in the compressed sign bit 1005, block 1475 transfers control to block 1480. Otherwise, block 1475 terminates the program.

Block 1480 stores the algebraic sign extracted in block 1440 from the compressed floating point number 1000 in the decompressed sign bit 1305 of the decompressed floating point number 1300. Block 1480 then terminates the decompression software program 1400.

FIG. 15 is a bit map of an illustrative numerical example in which a compressed number is decompressed into a floating point number according to a representative embodiment. In this figure, the decompression bias constant 700 is added to the compressed floating point number 1000. For the illustrative example prior to the addition, the compressed floating point number 1000 with its sign bit cleared is aligned with the decompression bias constant 700 such that the leftmost bit of the compressed floating point number 1000 is just to the left of the extraction point 440. Setting the sign bit of this addition results in the decompressed floating point number 1300 which has a recovered decimal value of 0.75. Note that the value of the decompressed floating point number 1300 will not always be exactly equal to the value of the non-compressed number 1200 due to a lack of precision in the compression/decompression process.

2.7 Computer System

Figure 16:
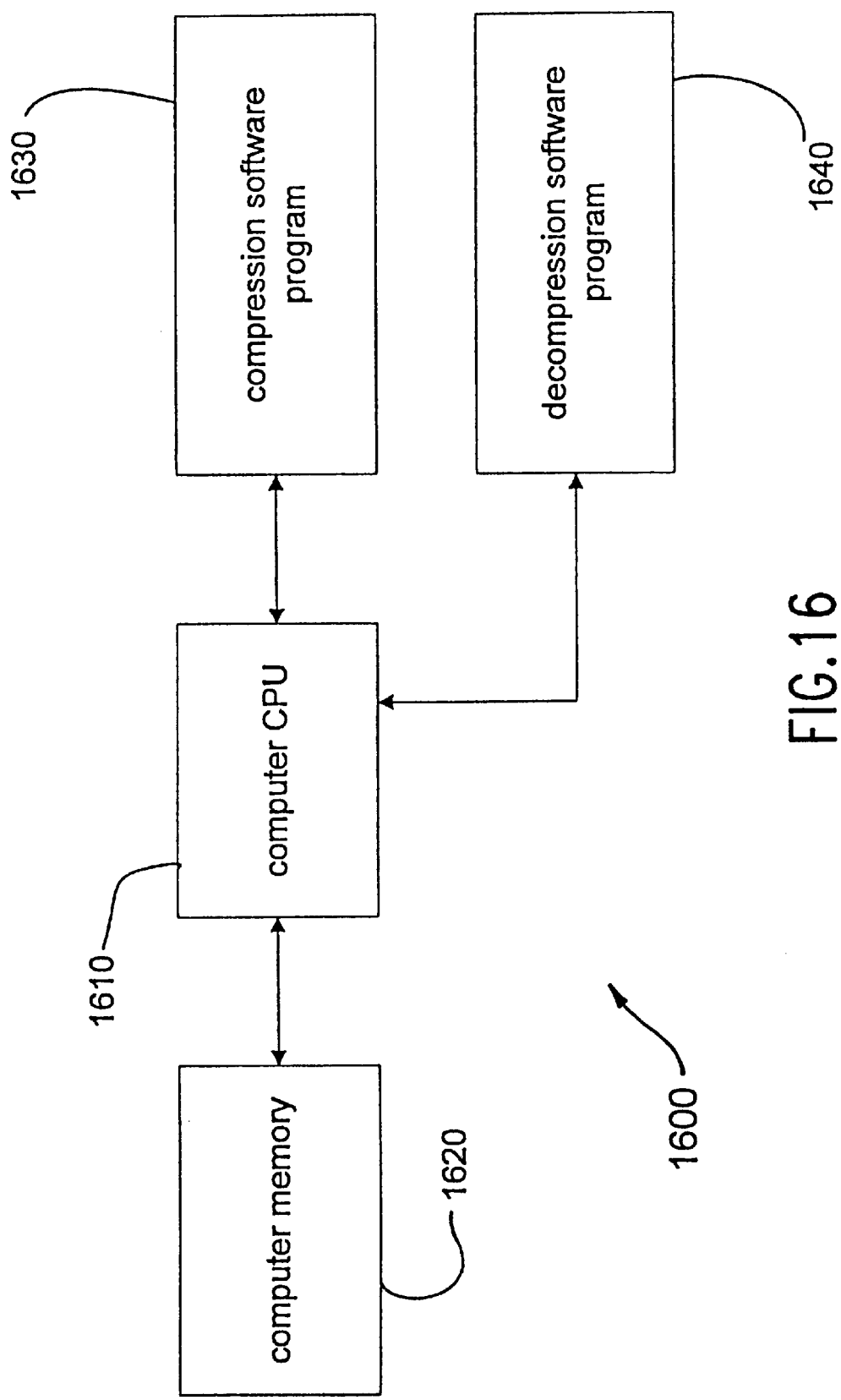
FIG. 16 is a drawing of a computer system for compressing and decompressing floating point numbers according to a representative embodiment.

FIG. 16 is a drawing of a computer system 1600 for compressing and decompressing the value of the floating-point-format number 300. The computer system 1600 consists of a computer central processing unit 1610, also referred to herein as a computer CPU 1610, to which is connected a computer memory 1620, also referred to herein as a memory 1620. A compression software program 1630 running on the computer CPU 1610 compresses the floating-point-format number 300 into the compressed floating point number 1000. The decompression software program 1640 decompresses the compressed floating point number 1000 into the decompressed floating point number 1300.

2.8 Hardware Representative Implementation—Compression

In addition to implementation as a software program or procedure, representative embodiments of the compression and decompression methods of the present patent document could be implemented in hardware, as for example in an accelerator chip. In such embodiments, floating-point-format numbers 300 could be transferred to the hardware implementation from an application or driver program or from additional upstream hardware in the process flow.

Figure 17:
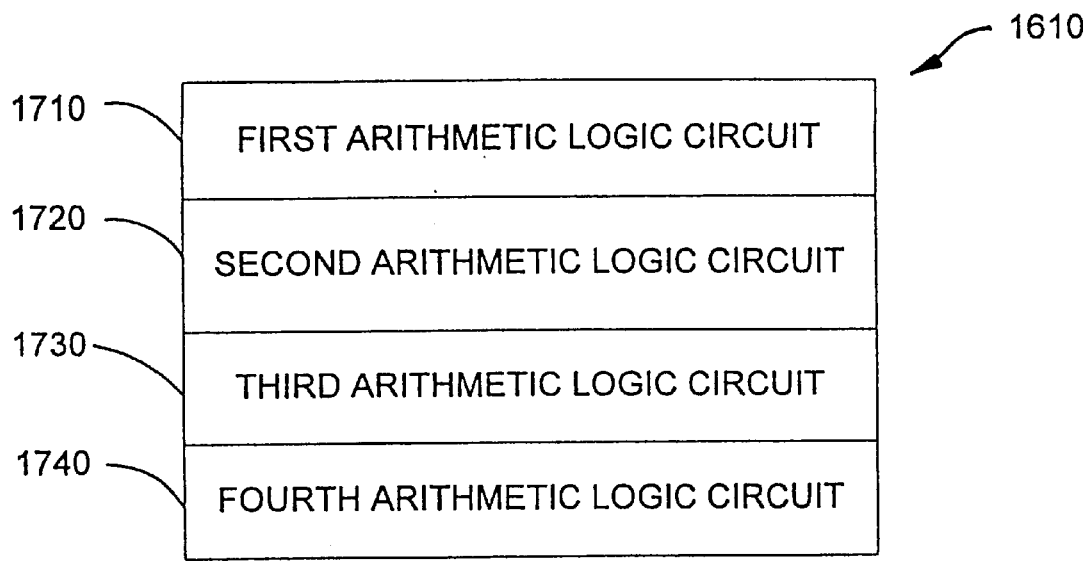
FIG. 17 is a drawing of a hardware embodiment for compressing a floating point number according to a representative embodiment.

FIG. 17 is a drawing of a hardware implementation for compressing a floating-point-format number 300 according to a representative embodiment. In this embodiment, several constants are either specified or computed. In practice, they are specified or computed prior to the compression of the floating-point-format number 300 into the compressed representation 1030, but the following discussion does not always follow that order. For a given implementation these constants need to be specified or computed only once and then stored, for example in a register, for future use. These constants include (1) the number of binary digits used in the compressed representation, (2) whether or not decompression results have mixed signed values, (3) whether or not decompression results include zero, (4) the largest non-compressed absolute value, (5) the smallest, non-zero non-compressed absolute value, and (6) the compression rounding method. Also in various representative embodiments, there are three compression rounding methods: (1) "Round down", (2) "Round to Nearest", and (3) "Round up". The range of numbers to be compressed, referred to herein as the range of compressible numbers, is also specified.

In FIG. 17, arithmetic logic circuits in the computer CPU 1610 of the computer system 1600 are used to compress the floating-point-format number 300 into the compressed representation 1030 and store the compressed representation 1030 in the memory 1620 of the computer system 1600. The computer CPU 1610 comprises a first arithmetic logic circuit 1710 configured to access data from the memory 1620 of the computer system 1600 for accessing the floating-point-format number 300 stored in the memory 1620, a second arithmetic logic circuit 1720 configured to take an absolute value of a number, a third arithmetic logic circuit 1730 configured to subtract one number from another, and a fourth arithmetic logic circuit 1740 configured to copy data from one location in the memory 1620 to another.

When the floating-point-format number 300 is less than zero, the second arithmetic logic circuit 1720 takes an absolute value of the floating-point-format number 300. Also when the floating-point-format number 300 is less than zero, the third arithmetic logic circuit 1730 subtracts a specified compression bias constant 600 from the absolute value of the floating-point-format number 300 to obtain a difference value 430, wherein the subtraction is performed in a manner that treats the compression bias constant 600 and the absolute value of the floating-point-format number 300 as though they were both fixed-point-format binary numbers. Otherwise, the third arithmetic logic circuit 1730 subtracts the compression bias constant 600 from the floating-point-format number 300 to obtain a difference value 430, wherein the subtraction is performed in a manner that treats the compression bias constant 600 and the floating-point-format number 300 as though they were both fixed-point-format binary numbers.

When the difference value 430 is less than or equal to zero, a fourth arithmetic logic circuit 1740 configured to copy data from one location in the memory 1620 to another copies zero into the compressed representation 1030.

When the difference value 430 is greater than zero, the fourth arithmetic logic circuit 1740 copies into the compressed representation 1030 a field of contiguous bits within the difference value 430, such that the number of bits in the field of contiguous bits is equal to a specified compressed representation field size 450, the bit position of the most significant bit in the field of contiguous bits corresponds to a specified extraction bit position 440 in the difference value 430, and the most significant bit of the compressed representation 1030 corresponds to the most significant bit of the field of contiguous bits.

When algebraic signs are stored, the fourth arithmetic logic circuit 1740 copies a sign bit 1005 into the memory 1620 associated with the compressed representation 1030, wherein the sign bit 1005 is equal to the sign of the floating-point-format number 300.

In a representative embodiment, the extraction bit position 440 is specified as in the following. This computation does not need to be performed more than once for a given implementation. The third arithmetic logic circuit 1730 subtracts the smallest, non-zero non-compressed number 420 from a largest non-compressed number 410, wherein the largest non-compressed number 410 is the absolute magnitude of the specified largest floating-point-format number 300 in a domain of floating-point-format numbers 300 specified to be compressed. And the fourth arithmetic logic circuit 1740 further copies the bit position number of the most significant bit in the result of the subtraction of the smallest, non-zero non-compressed number 420 from the largest non-compressed number 410 which contains a one into the extraction bit position 440.

In a representative embodiment, the compression bias constant 600 is specified as in the following. This computation does not need to be performed more than once for a given implementation. The third arithmetic logic circuit 1730 subtracts a specified floating-point-format compression rounding constant 500 from a largest non-compressed number 410, wherein the largest non-compressed number 410 is the absolute magnitude of the largest-floating-point-format number 300 in the domain of the floating-point-format numbers 300 specified to be compressed, wherein the subtraction is performed in a manner that treats the compression rounding constant 500 and the largest non-compressed number 410 as though they were both fixed-point-format binary numbers. And the fourth arithmetic logic circuit 1740 copies the result of the subtraction of the floating-point-format compression rounding constant 500 from the largest non-compressed number 410 into the compression bias constant 600.

In a representative embodiment, the compression rounding constant 500 is specified to be the round down constant 510 which is computed as in the following. This computation does not need to be performed more than once for a given implementation. The fourth arithmetic logic circuit 1740 copies, beginning with the extraction bit position 440 in the compression rounding constant 500 and extending toward the least significant bit, a one into each of the corresponding contiguous compressed representation field size 450 bits. And the fourth arithmetic logic circuit 1740 copies zeros into all other bit positions of the compression rounding constant 500.

In another representative embodiment, the compression rounding constant 500 is specified to be the round nearest constant 510 which is computed as in the following. This computation does not need to be performed more than once for a given implementation. The fourth arithmetic logic circuit 1740 further copies, beginning with the extraction bit position 440 in the compression rounding constant 500 and extending toward its least significant bit, a one into each of the corresponding contiguous compressed representation field size 450 plus one bits. And the fourth arithmetic logic circuit 1740 copies zeros into all other bit positions of the compression rounding constant 500.

In still another representative embodiment, the compression rounding constant 500 is specified to be the round up constant 510 which is computed as in the following. This computation does not need to be performed more than once for a given implementation. The fourth arithmetic logic circuit 1740 further copies, beginning with the extraction bit position 440 in the compression rounding constant 500 and extending to its least significant bit, a one into each of the corresponding contiguous bits. And the fourth arithmetic logic circuit 1740 copies zeros into all other bit positions of the compression rounding constant 500.

2.9 Hardware Representative Implementation—Decompression

Figure 18:
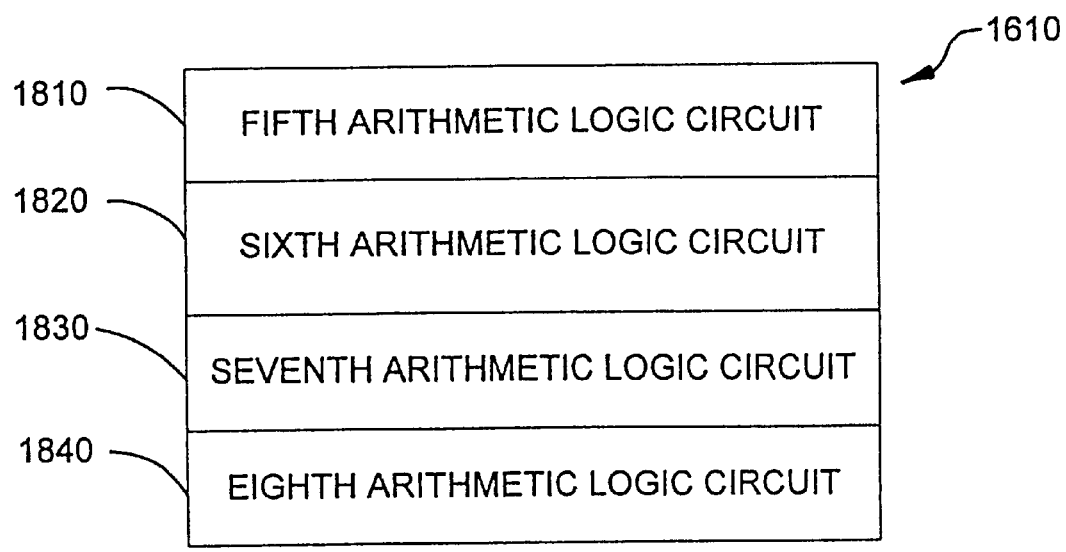
FIG. 18 is a drawing of a hardware embodiment for decompressing a compressed representation of a floating point number according to a representative embodiment.

FIG. 18 is a drawing of a hardware implementation for decompressing a compressed representation of a floating point number according to a representative embodiment. In this representative embodiment, arithmetic logic circuits in the computer CPU 1610 of the computer system 1600 are used to decompress a decompressed-floating-point-format number 1300 from the compressed representation 1030 of the floating-point-format number 300 stored in a memory 1620. In this embodiment, several constants are either specified or computed prior to decompression. In practice, they are specified or computed prior to the compression of the floating-point-format number 300 into the compressed representation 1030, but the following discussion does not always follow that order. For a given implementation these constants need to be specified or computed only once and then stored, for example in a register, for future use. These constants include (1) the number of binary digits used in the compressed representation, (2) whether or not decompression results have mixed signed values, (3) whether or not decompression results include zero, (4) the largest non-compressed absolute value, (5) the smallest, non-zero non-compressed absolute value, and (6) the compression rounding method.

In FIG. 18, the computer CPU 1610 comprises a fifth arithmetic logic circuit 1810 configured to access data from the memory 1620 of the computer system 1600 for accessing the compressed representation 1030 stored in the memory 1620, a sixth arithmetic logic circuit 1820 configured to copy data from one location in the memory 1620 to another, a seventh arithmetic logic circuit 1830 configured to add one number to another, and an eighth arithmetic logic circuit 1840 configured to subtract one number from another.

When the compressed representation 1030 is zero and when zero lies in a domain of floating-point-format numbers 300 specified to be compressed, the sixth arithmetic logic circuit 1820 copies zero into the decompressed-floating-point-format number 1300.

Otherwise, the sixth arithmetic logic circuit 1820, beginning with the most significant bit in the compressed representation 1030, copies the compressed representation 1030 into the decompressed-floating-point-format number 1300 beginning at a specified insertion bit position 440 in the decompressed-floating-point-format number 1300 and extending toward the least significant bit in the decompressed-floating-point-format number 1300. The sixth arithmetic logic circuit 1820 further copies zero into all other bits in the decompressed-floating-point-format number 1300.

The seventh arithmetic logic circuit 1830 adds a specified decompression bias constant 700, wherein the decompression bias constant 700 is in floating point representation; to the decompressed-floating-point-format number 1300, wherein the adding step is performed in a manner that treats the decompression bias constant 700 and the decompressed-floating-point-format number 1300 as though both are fixed-point-format binary numbers.

When algebraic signs are stored, the sixth arithmetic logic circuit 1820 copies, into the decompressed-floating-point-format number 1300 sign bit, a sign bit 1005 stored in the memory 1620 associated with the compressed representation 1030.

The eighth arithmetic logic circuit 1840 configured to subtract one number from another subtracts the smallest, non-zero non-compressed number 420 from a specified largest non-compressed number 410, wherein the largest non-compressed number 410 is the absolute magnitude of the largest floating-point-format number 300 in the domain of floating-point-format numbers 300 to be compressed. And the sixth arithmetic logic circuit 1820 further copies, into the insertion bit position 440, the number of the largest significant bit position in the result of subtracting the smallest, non-zero non-compressed number 420 from the largest non-compressed number 410 which contains a one.

The sixth arithmetic logic circuit 1820 copies, beginning with the insertion bit position 440 in a compression rounding constant 500, wherein the compression rounding constant 500 is in floating point format, and extending toward the least significant bit, a one in each of a corresponding contiguous specified compressed representation field size 450 bits, wherein the compressed representation field size 450 is the number of bits in the compressed representation 1030. And the sixth arithmetic logic circuit 1820 further copies zeros into all other bit positions of the compression rounding constant 500. The eighth arithmetic logic circuit 1840 further subtracts the compression rounding constant 500 from a specified largest non-compressed number 410, wherein the largest non-compressed number 410 is the absolute magnitude of the largest floating-point-format number 300 in the domain of floating-point-format numbers 300 to be compressed, to determine a difference value 430, wherein the subtracting step is performed in a manner that treats the compression rounding constant 500 and the largest non-compressed number 410 as though they were both fixed-point-format binary numbers. And the sixth arithmetic logic circuit 1820 copies the result of subtracting the compression rounding constant 500 from the largest non-compressed number 410 into the decompression bias constant 700.

2.10 Closing Discussion—Compression/Decompression of Floating Point Numbers

A primary advantage of the embodiments described herein over prior techniques is the compression of floating-point-format numbers 300 rapidly and, in some cases, without significant loss of fidelity. Compressed floating point numbers 1000 allow applications to utilize larger data sets with high performance. The representative methods are simple and fast. They can be implemented in hardware with minimal cost and complexity, and with essentially full performance.

Decompressed values can be constructed in CPU local, very high speed memory (registers) which also reduces memory accesses. Also, the representative embodiments is very fast and is easy to implement since the only arithmetic functions utilized are binary subtraction and addition which are relatively fast on most computers.

3.0 Surface Normal Compression/Decompression

This section describes the rendering of three-dimensional images on a computer screen and, in representative embodiments, methods for compressing surface normal data.

3.1 Introduction

Representative embodiments relate to methods of compression and decompression of surface normal data used in the rendering of three dimensional images. As an intermediate step, surface normal data is stored in compressed format and then decompressed for use in rendering three dimensional images on the screen of a computer, a printer, or other appropriate device. A representative embodiment provides a memory and computational efficient method of compressing and decompressing surface normals of three dimensional images. Compressed surface normals may be, but are not required to be, of unit length. Unit length normals are, however, expected by most standard graphics libraries. Each vector component of the surface normal must lie within the range specified which typically is between −1 and +1.

3.2 Geometric Descriptions

Figure 19:
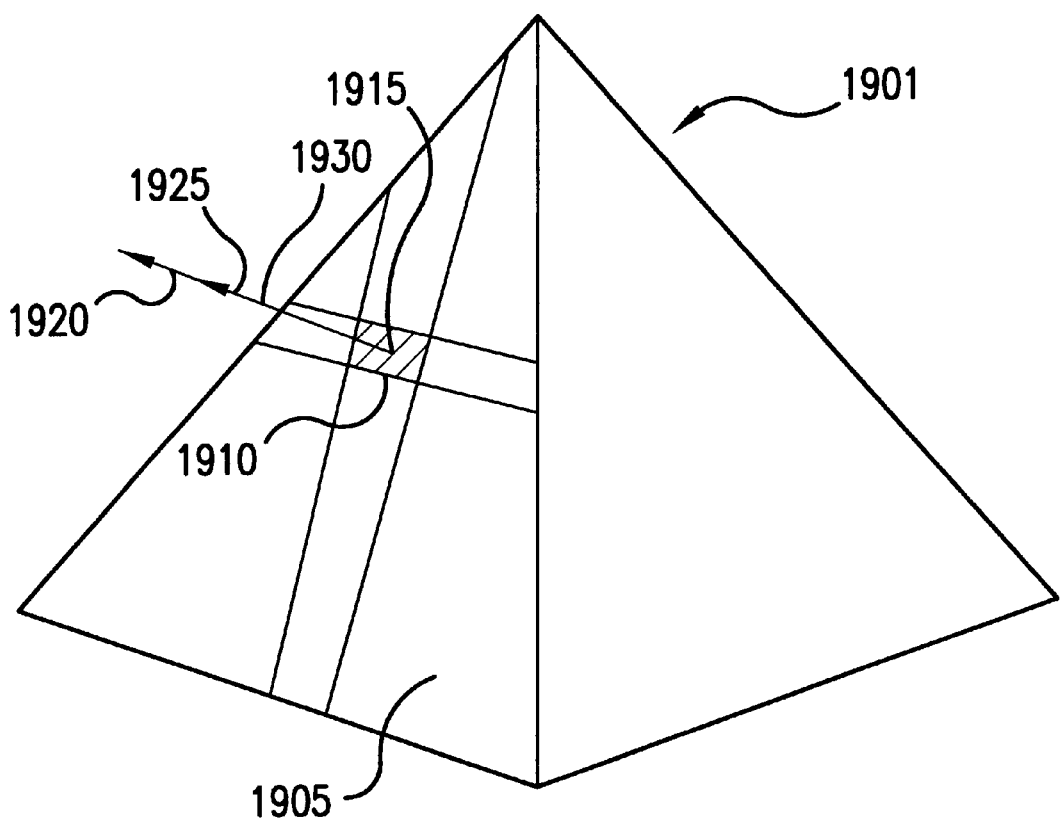
FIG. 19 is a three dimensional drawing of a tetrahedron showing a surface normal associated with a small area.

FIG. 19 is an illustrative drawing of a three dimensional figure 1901, a tetrahedron in this example, having a surface 1905. A small surface area 1910 on the surface 1905 surrounds a point 1915. The point 1915 has passing through it, a surface normal 1920 which is a vector that has direction perpendicular to the surface 1905 at the point 1915 and which is described by three floating point numbers {x,y,z} representing vector components of the surface normal 1920. The surface normal 1920 at the point 1915 is assumed to represent the surface normal 1920 for all points lying within the small surface area 1910. Although only one small surface area 1910 is shown in FIG. 19, the surface 1905 is conceptually divided into many small surface areas 1910. A unit length surface normal 1925 is shown which is the vector resulting from scaling the surface normal 1920 to unit length. Also shown in FIG. 19 is a decompressed surface normal 1930 which is obtained by decompressing the compression of the surface normal 1920. There may be some difference between the decompressed surface normal 1930 and the surface normal 1920 due to a loss of precision in the compression/decompression processes.

One complete tetrahedral face of the three dimensional figure 1901 could have been represented by the single surface normal 1920 and its associated single unit length surface normal 1925. However, for purposes of illustration this relatively simple figure is conceptually broken up into a number of small surface areas 1910 as a more complicated surface, such as a curved surface, would be.

Figure 20:
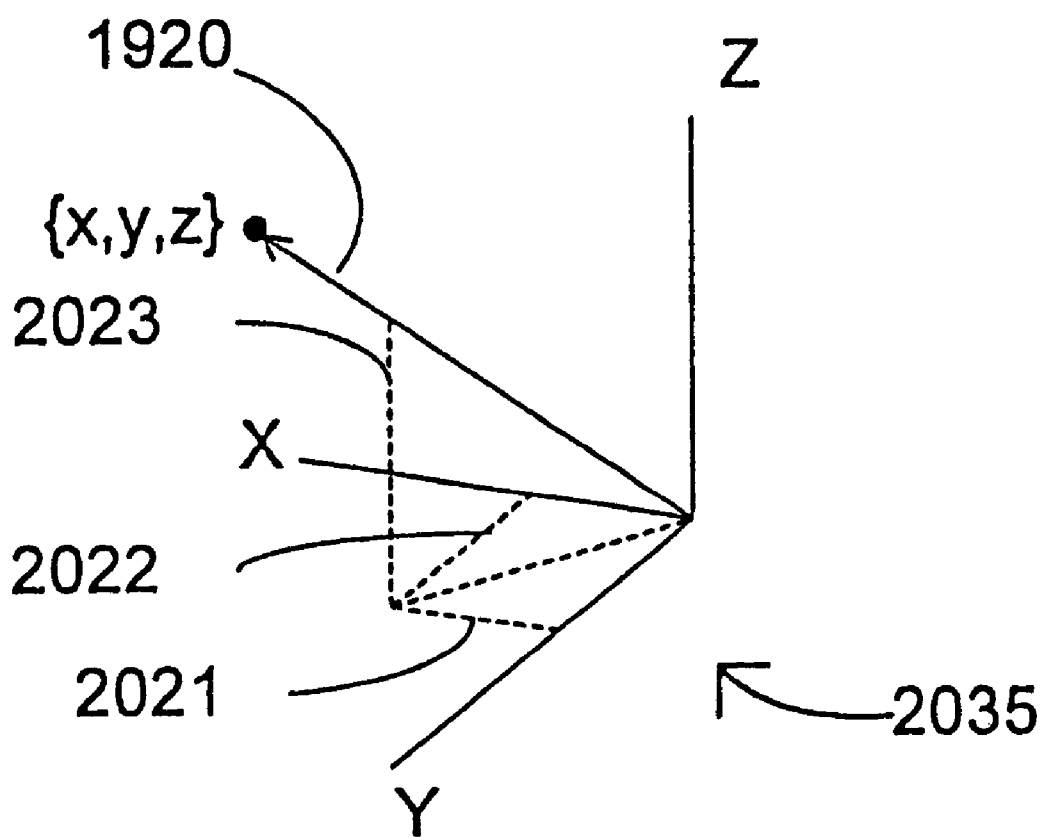
FIG. 20 is a representative drawing of a surface normal in a Cartesian coordinate system.

FIG. 20 is a drawing of a Cartesian coordinate system 2035. If the surface normal 1920 is represented by any set of coordinates other than those of a Cartesian coordinate system 2035, this representation is first transformed into Cartesian coordinates wherein the surface normal 1920 is represented by three floating point coordinates {x,y,z} of the Cartesian coordinate system 2035. Note that the location and orientation of the Cartesian coordinate system 2035 is completely arbitrary, and the Cartesian coordinate system 2035 shown in FIG. 20 is shown for illustrative purposes only. The Cartesian coordinate system 2035 representation of the surface normal 1920 may be scaled to unit length prior to compression to form the unit length surface normal 1925 which is a vector of unit length having direction perpendicular to the surface 1905 at the point 1915, i.e., parallel to the surface normal 1920. Either the surface normal 1920 or the unit length surface normal 1925 is then compressed in accordance with the methods to be further described below. Since the compression and decompression techniques are the same for the surface normal 1920 and for the unit length surface normal 1925, for clarity of description the following discussion will refer to the surface normal 1920 without referring to the unit length surface normal 1925. However, in practice either the surface normal 1920 or the unit length surface normal 1925 could be compressed and/or decompressed.

The surface normal 1925 has three vector components; a first vector component 2021, a second vector component 2022, and a third vector component 2023. In the example of FIG. 20, the first vector component 2021 is shown directed along the X-axis of the Cartesian coordinate system 2035, the second vector component 2022 is shown directed along the Y-axis, and the third vector component 2023 is shown directed along the Z-axis. However, the particular axes of the Cartesian coordinate system 2035 along which the first vector component 2021, the second vector component 2022, and the third vector component 2023 are directed can be arbitrarily specified by the user. In a representative embodiment, the compressed form of the surface normal 1920 is stored in computer memory by storing the values of the first vector component 2021, the second vector component 2022, and the third vector component 2023.

3.3 Compression

Figure 21:
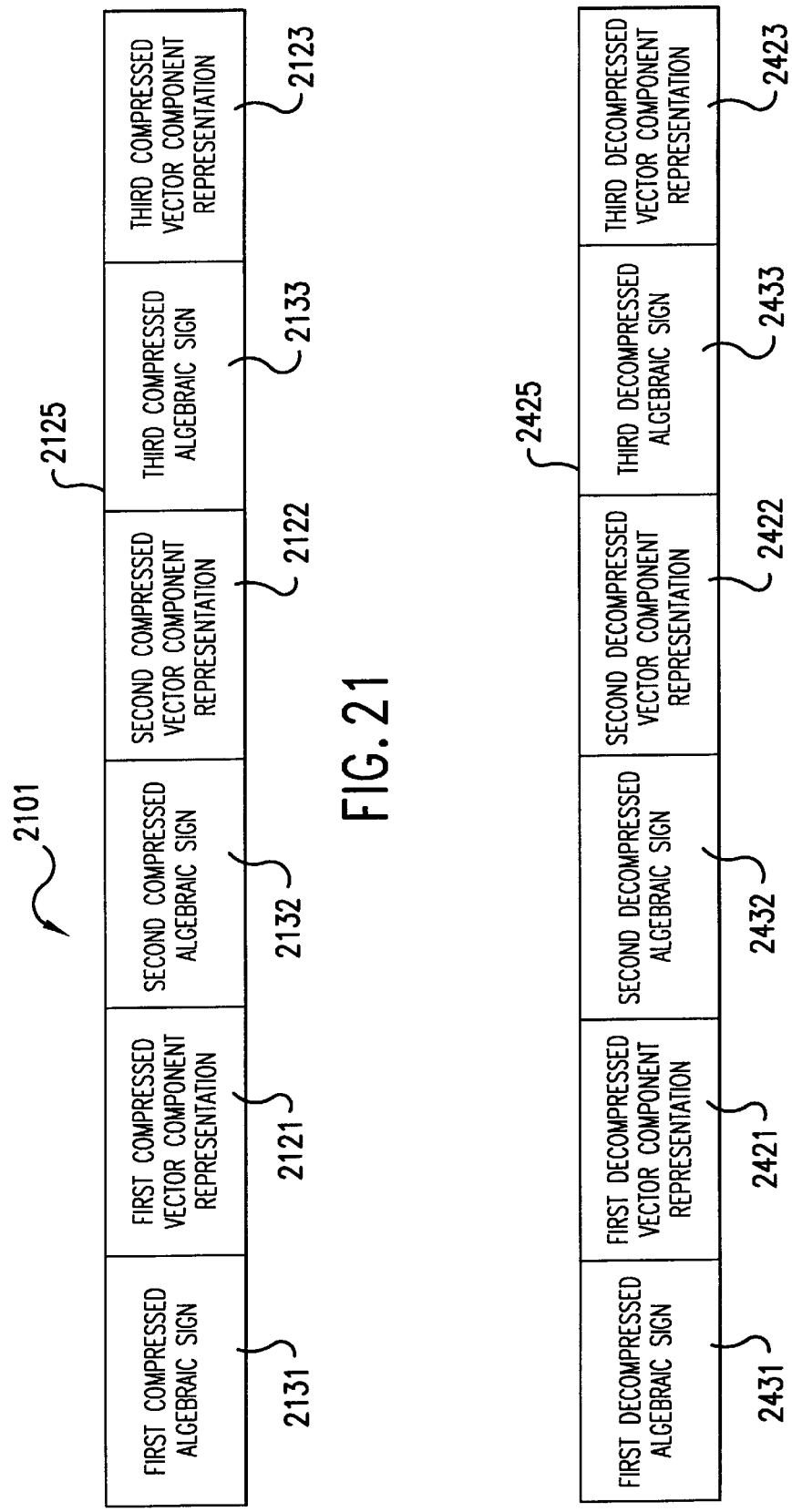
FIG. 21 is a schematic drawing of a segment of computer memory used in a representative embodiment.

FIG. 21 is a schematic drawing of a computer memory segment 2101 which is used in a representative embodiment to store a compressed vector representation 2125 of the surface normal 1920, wherein the compressed vector representation 2125 comprises the compressed magnitude of the first vector component 2021 as a first compressed vector component representation 2121 and the algebraic sign of the first vector component 2021 as a first compressed algebraic sign 2131, the compressed magnitude of the second vector component 2022 as a second compressed vector component representation 2122 and the algebraic sign of the second vector component 2022 as a second compressed algebraic sign 2132, and the compressed magnitude of the third vector component 2023 as a third compressed vector component representation 2123 and the algebraic sign of the third vector component 2023 as a third compressed algebraic sign 2133. These values are stored in an order in memory specified by the user.

In an alternative representative embodiment in which algebraic signs of the vector components are not stored, the compressed vector representation 2125 of the surface normal 1920 comprises the compressed magnitude of the first vector component 2021 as a first compressed vector component representation 2121, the compressed magnitude of the second vector component 2022 as a second compressed vector component representation 2122, and the compressed magnitude of the third vector component 2023 as a third compressed vector component representation 2123. Again, these values are stored in an order in memory specified by the user.

Figure 22:
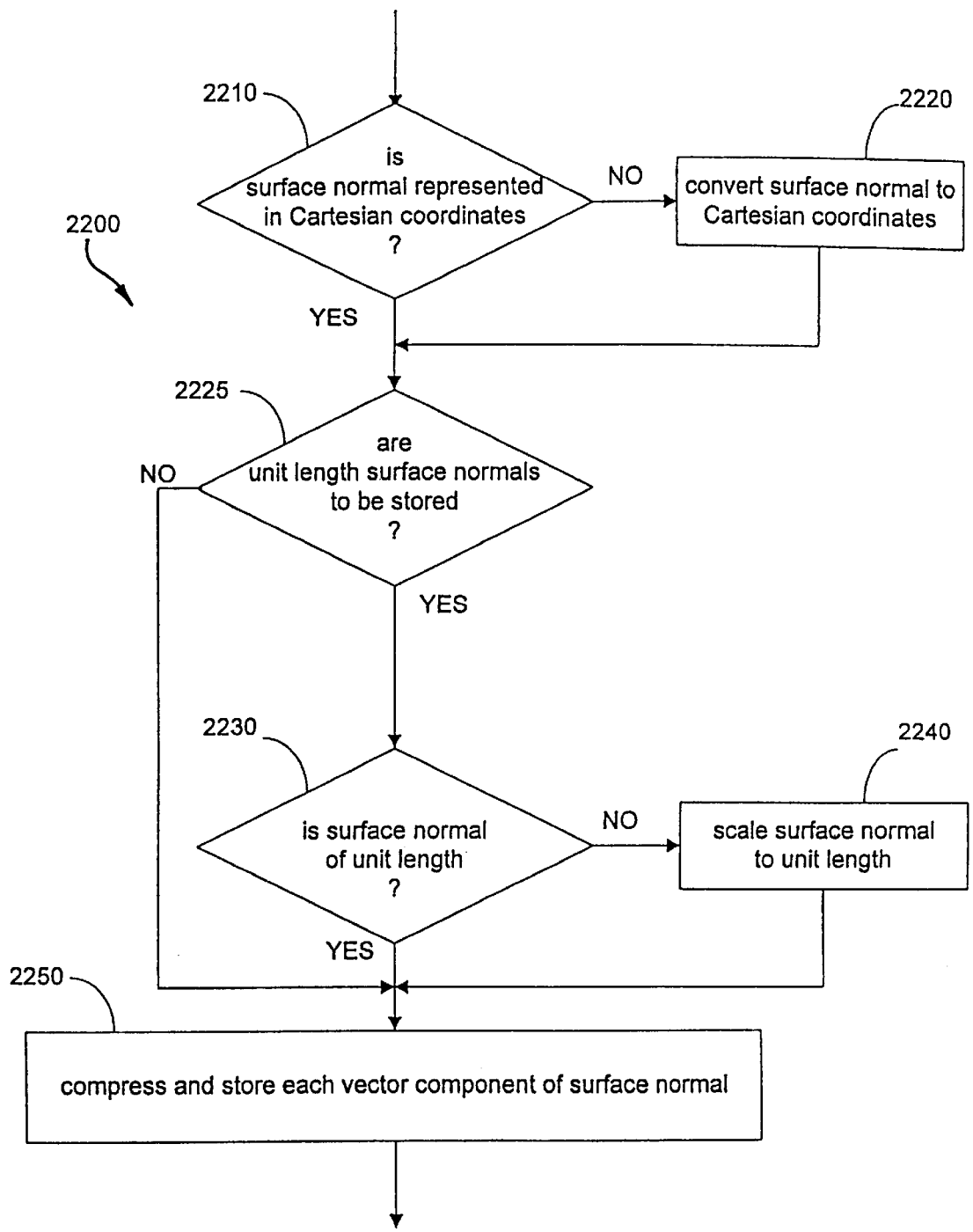
FIG. 22 is a flow chart of a computer program for compressing a surface normal according to a representative embodiment.

FIG. 22 is a flowchart of a surface normal data compression computer program 2200 that compresses or maps the surface normal 1920 into a compressed vector representation 2125. The compression techniques discussed in relationship to FIG. 22 use the data structures shown in FIG. 21.

Block 2210 is the entry block into the surface normal data compression computer program 2200 and determines whether or not the surface normal 1920 is represented in Cartesian coordinates. When the surface normal 1920 is represented in Cartesian coordinates, block 2210 transfers control to block 2225. Otherwise, block 2210 transfers control to block 2220.

Block 2220 converts the surface normal 1920 into Cartesian coordinates. Control then is transferred to block 2225.

When unit length surface normals 1925 are to be stored, block 2225 transfers control to block 2230. Otherwise, block 2225 transfers control to block 2250.

When the surface normal 1920 is scaled to unit length, block 2230 transfers control to block 2250. Otherwise, block 2230 transfers control to block 2240.

Block 2240 scales the surface normal 1920 to unit length. Block 2240 transfers control to block 2250.

Block 2250 compresses and stores the first compressed vector component representation 2121 and the first compressed algebraic sign 2131 for the first vector component 2021, the second compressed vector component representation 2122 and the second compressed algebraic sign 2132 for the second vector component 2022, and the third compressed vector component representation 2123 and the third compressed algebraic sign 2133 for the third vector component 2023 in the computer memory segment 2101 shown in FIG. 21.

In the alternative representative embodiment in which algebraic signs of the vector components are not stored, block 2250 compresses and stores the first compressed vector component representation 2121 for the first vector component 2021, the second compressed vector component representation 2122 for the second vector component 2022, and the third compressed vector component representation 2123 for the third vector component 2023 in the computer memory segment 2101 shown in FIG. 21.

3.3.1 Illustrative Example of Compression

Constants and characteristics needed for compression of the vector components of the surface normal 1920 are the same as previously identified in section 2.4. These six characteristics which should be pre-specified or predetermined are as follows: (1) the number of binary digits used in the compressed representation, discussed in section 2.4.1, (2) whether or not decompression results have mixed signed values, discussed in section 2.4.2, (3) whether or not decompression results include zero, discussed in section 2.4.3, (4) the largest non-compressed absolute value, discussed in section 2.4.4, (5) the smallest, non-zero non-compressed absolute value, discussed in section 2.4.5, (6) the compression rounding method used, discussed in section 2.4.7. In representative embodiments there are three compression rounding methods: (1) "Round down", (2) "Round to Nearest", and (3) "Round up". The range of numbers to be compressed, referred to herein as the range of compressible numbers, is also specified.

The following example is used for purposes of illustrating the compression process for the surface normal 1920. In this example, the first, second, and third compressed vector component representations 2121,2122,2123 of the surface normal 1920 are stored in a total of four bytes. Ten bits are allocated for each compressed vector component representation 2121,2122,2123 with one of the ten bits allocated for the sign bit, thus permitting mixed signed values. In this example representation two of the thirty-two bits in the four bytes would be wasted. Surface normals 1920 are typically converted to unit length, if they are not already in that format. As such, the largest non-compressed absolute value 410 for any of the vector components 2021,2022,2023 is one. In floating point format, the digital number one is represented as "0,0111,1111,0000,0000,0000,0000,0000,000", where the commas have been added for clarity of reading. The leftmost comma separates the sign bit and the next two commas identify the exponent of the floating point number. This value is also shown in FIG. 4. Zero is included in permissible values in this example. The value chosen for the smallest, non-zero non-compressed absolute value 420 is based upon the precision desired. For the present example, 0.064 is taken as the smallest, non-zero non-compressed absolute value 420. The binary representation for the smallest, non-zero non-compressed absolute value 420 would then be "1.0000,0110,0010,0100,1101,110 $2^{-4}$". Biasing the exponent "+127" results in an exponent of 123 or in eight bits of binary, the exponent becomes "0111, 1011". With the sign bit set to zero, the floating point representation for the smallest, non-zero non-compressed absolute value 420 then becomes "0,0111,1011,0000,0110, 0010,0100,1101,110" which is the same value found in FIG. 4. Subtracting the smallest, non-zero non-compressed absolute value 420 from the largest non-compressed absolute value 410 as if both numbers were fixed-point-format binary numbers results in the difference value 430 of "0,0000,0011, 1111,1001,1101,1011,0010,010" in floating point format in which it is observed that bit position 24 is the most significant bit that contains a "1". Bit position 24 is then the extraction bit position 440, and again, this is the same value found in FIG. 4. For the present example the "round nearest" compression rounding method is used. The round nearest constant 520 then becomes "0,0000,0011,1111,111 1,0000, 0000,0000,000" in floating point format wherein one's have been placed in the 10 bit positions beginning with bit position 24 and extending toward the least significant bits. Subtracting the round nearest constant 520 from the largest non-compressed absolute value 410 as if both numbers were fixed-point-format binary numbers results in "0,0111,1011, 0000,0001,0000,0000,0000,000" as the compression bias constant 600 in floating point format.

Compression of the vector components 2021,2022,2023 of the surface normal 1920 into compressed format is performed as shown in FIG. 22. Block 2270 stores the first compressed vector component representation 2121 of the first vector component 2021, the second compressed vector component representation 2122 of the second vector component 2022, and the third compressed vector component representation 2123 of the third vector component 2023 in the computer memory segment 2101 shown in FIG. 21. The compressed vector component representations 2121,2122, 2123 are stored in a predefined order. Block 2270 is the termination point of the surface normal data compression program 2200.

In various embodiments, some of the method steps described by FIG. 22 are omitted. As an example, in one embodiment it could be assumed that surface normals 1920 are in Cartesian coordinates, and so blocks 2210 and 2220 would be omitted. In another embodiment, it could be predetermined that surface normals 1920 would not be normalized, in which case blocks 2225, 2230, and 2240 could be omitted. In yet another embodiment, it could be predetermined that surface normals 1920 would be normalized and block 2225 would be omitted. And in still another embodiment, it could be predetermined that normalization to some number other than one would be used. In which case, blocks 2230 and 2240 would be changed accordingly.

Continuing the above example for the following values of the vector components 2021,2022,2023: (1) x=0.7500, (2) y=0.3000, and (3) z=−0.5895, the binary representations for the absolute values respectively for these three numbers are (1) "1100,0000,0000,0000,0000,0000",(2) "0100,1100, 1100,1100,1100,1100,1", and (3) "1001,0110,1110,1001, 0111,1000", and after setting the sign bits to zero, their floating point number representations are (1) "0,0111,1110, 1000,0000,0000,0000,0000,000", (2) "0,0111,1101,0011, 0011,0011,0011,0011,001", and (3) "0,0111,1110,0010, 1101,1101,0010,1111,000" respectively. Subtracting the compression bias constant 600 from each of these numbers as if they are both fixed-point-binary numbers and extracting 9 bits from the resultant at the extraction bit position 440 and toward the least significant bit results in first, second, and third compressed vector component representations 2121, 2122,2223 including sign bits of (1) "0,1101,1111,1", (2) "0,1000,1100,1", and (3) "1,1100,1011,0" respectively where the sign bit has been reset as appropriate.

3.4 Decompression

FIG. 23 is a flowchart of a representative embodiment of the surface normal data decompression computer program 2300 that decompresses or maps the compressed vector representation 2125 of the surface normal 1920 into the decompressed surface normal 1930. The decompression techniques discussed in relationship to FIG. 23 use the data structures shown in FIG. 21 and in FIG. 24. FIG. 24 is a drawing of a data structure of a decompressed surface normal representation 2425 which in a representative embodiment contains the values for the vector components of the decompressed surface normal 1930. The decompressed surface normal representation 2425 comprises a first decompressed algebraic sign 2431, a first decompressed vector component representation 2421, a second decompressed algebraic sign 2432, a second decompressed vector component representation 2422, a third decompressed algebraic sign 2433, and a third decompressed vector component representation 2423.

In FIG. 23, block 2310 is the entry point into the surface normal data decompression computer program 2300. Block 2310 retrieves from computer memory compressed representations of the first vector component 2021 which is stored as the first compressed vector component representation 2121 and the first compressed algebraic sign 2131, the second vector component 2022 which is stored as the second compressed vector component representation 2122 and the second compressed algebraic sign 2132, and the third vector component 2023 which is stored as the third compressed vector component representation 2123 and the third compressed algebraic sign 2133. Block 2310 then transfers control to block 2320.

In the alternative embodiment in which algebraic signs are not stored, block 2310 retrieves from computer memory compressed representations of the first vector component 2021 which is stored as the first compressed vector component representation 2121, the second vector component 2022 which is stored as the second compressed vector component representation 2122, and the third vector component 2023 which is stored as the third compressed vector component representation 2123. Block 2310 then transfers control to block 2320.

Block 2320 decompresses the compressed format surface normal vector components with the first compressed vector component representation 2121 and the first compressed algebraic sign 2131 being decompressed into the first decompressed vector component representation 2421 and the first decompressed algebraic sign 2431, the second compressed vector component representation 2122 and the second compressed algebraic sign 2132 being decompressed into the second decompressed vector component representation 2422 and the second decompressed algebraic sign 2432, and the third compressed vector component representation 2123 and the third compressed algebraic sign 2133 being decompressed into the third decompressed vector component representation 2423 and the third decompressed algebraic sign 2433. Block 2320 terminates the decompression computer program 2300.

In the alternative representative embodiment in which algebraic signs are not stored in the compressed vector representation 2125 of the surface normal 1920, block 2320 decompresses the compressed format surface normal vector components with the first compressed vector component representation 2121 being decompressed into the first decompressed vector component representation 2421, the second compressed vector component representation 2122 being decompressed into the second decompressed vector component representation 2422, and the third compressed vector component representation 2123 being decompressed into the third decompressed vector component representation 2423. Block 2320 terminates the decompression computer program 2300.

3.4.1 Illustrative Example of Decompression

For the compressed vector representation 2125 of the surface normal 1920 obtained in section 3.3.1, the first, second, and third compressed vector component representations 2121,2122,2123 are as follows: (1) "0,1101,11 11,1", (2) "0,1000,1100,1", and (3) "1,1100,1011,0". The method for decompressing a compressed floating point number representation 300 is discussed in detail in section 2.6. Decompression proceeds by first obtaining the decompression bias constant 700. The decompression bias constant 700 is the result of subtracting the round down constant 510 from the largest non-compressed number 410 as if both numbers were fixed-point-format binary numbers. The round down constant 510 is "0,0000,0011,1111,1110,0000,0000,0000, 000" in floating point format wherein one's have been placed in the 9 bit positions beginning with bit position 24 and extending toward the least significant bit. Subtracting the round down constant 510 from the largest non-compressed absolute value 410 as if both numbers were fixed-point-format binary numbers results in "0,0111,1011, 0000,0010,0000,0000,0000,000" for the decompression bias constant 700. Then, setting the sign bits to zero as needed and adding the decompression bias constant 700 to the first, second, and third compressed vector component representations 2121,2122,2123 as if both numbers were fixed-point-format binary numbers, the most significant bit of each compressed vector component representation 2121,2122, 2123 is aligned with the extraction bit position 440, also referred to as the insertion bit position 440, in the decompression bias constant 700. Following completion of these steps, the decompressed-floating-point-format numbers 1300 for the first, second, and third vector components 2021,2022,2023 are as follows: (1) "0,0111,1110,1000, 0000,0000,0000,0000,000", (2) "0,0111,1101,0011,0100, 0000,0000,0000,000", and (3) "1,0111,1110,0010,1110, 0000,0000,0000,000". Recovering the decimal representation of these floating point format numbers results in (1) 0.7500, (2) 0.2969, and (3) −0.5898. The absolute magnitude of the decompressed value for the surface normal 1920 is 1.04 which is not quite of unit length due to the loss of precision in the compression/decompression process.

3.5 Computer System for Compression/Decompression of Surface Normals

Figure 25:
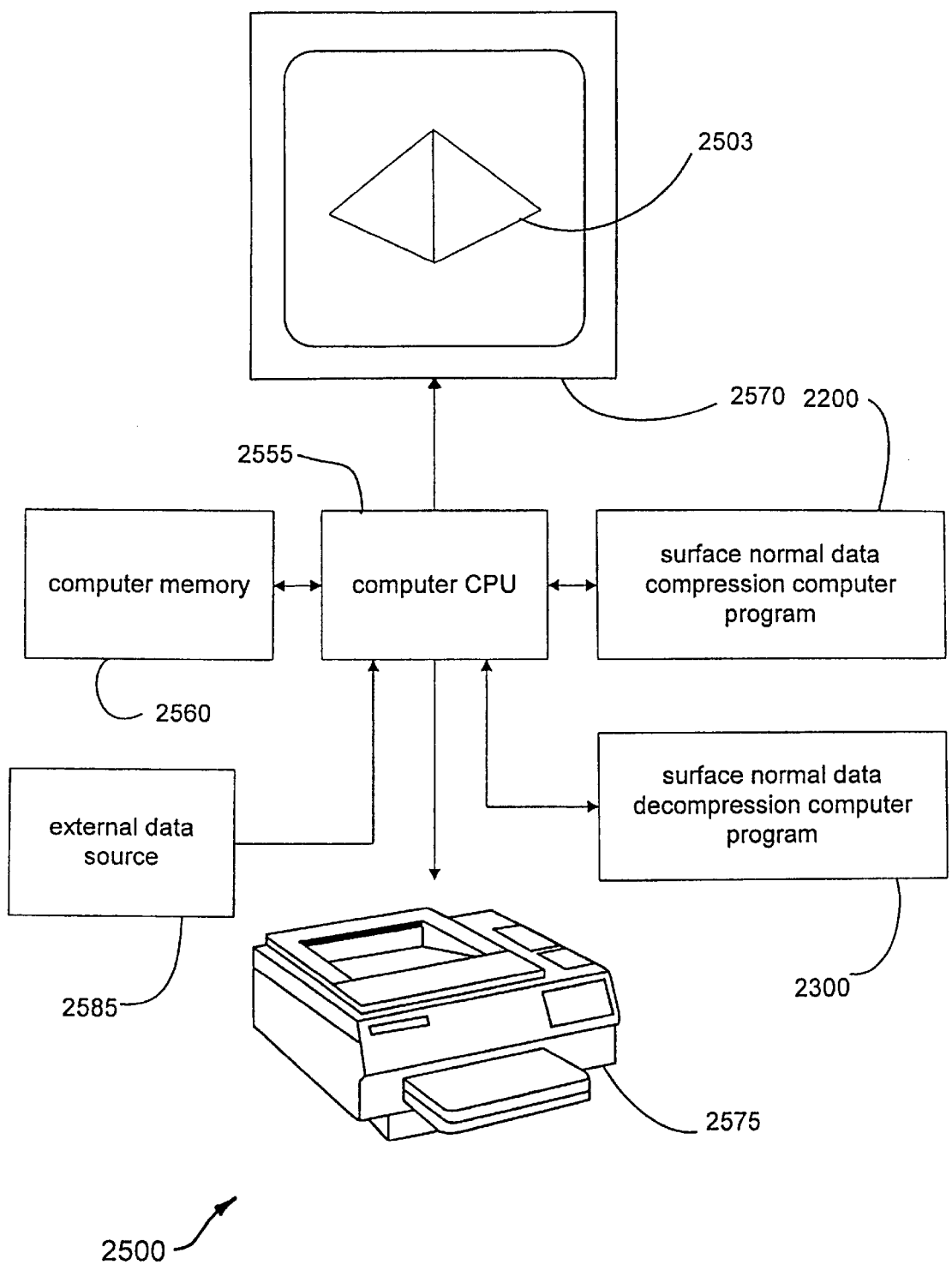
FIG. 25 is a drawing of a computer system suitable for rendering a three dimensional image using methods for surface normal compression and decompression according to a representative embodiment.

FIG. 25 is a schematic drawing of a computer system 2500 for rendering three dimensional figures, as for example the three dimensional figure 1901 of FIG. 19, into a three dimensional image 2503 using the methods of surface normal compression and decompression described herein. Computer system 2500 comprises the following hardware: a computer CPU 2555, a computer memory 2560, and a display device which in this figure is represented both as a computer monitor 2570 and as a printer 2575. A surface normal data compression computer program 2200 loaded in the computer system 2500 obtains input data containing the surface normals 1920 for the three dimensional FIG. 1901 either internally from the computer memory 2560, which may be for example hard magnetic disk, floppy disk, or computer active memory, an external data source 2585, which may be for example a computer operator, a communications network, another computer system, or other means. As shown above, the surface normal data compression computer program 2200 compresses surface normals 1920 and stores those values. A surface normal data decompression computer program 2300 decompresses the compressed vector representation 2125 of the surface normal 1920 for use in the rendering of the three dimensional figure 1901 into the three dimensional image 2503 on the computer monitor 2570, the printer 2575, or another display device.

Representative embodiments provide methods to compress or map the surface normal 1920 in Cartesian, spherical, or any other coordinate system into the compressed vector representation 2125 of the surface normal 1920 for the small surface area 1910 through which it passes. Other embodiments also provide methods to map from the compressed vector representation 2125 of the surface normal 1920 back to the decompressed surface normal 1930. The decompressed surface normal 1930 is needed at the time the three dimensional figure 1901 is rendered as the three dimensional image 2503 on the display device, either the computer monitor 2570, the printer 2575, or some other device, of the computer system 2500.

4.0 Closing Discussion

In addition to implementation as a software program or procedure, the compression and decompression techniques described herein could be implemented in hardware, as for example in a graphics accelerator chip. In such embodiments, surface normal data could be transferred to the hardware implementation from an application or driver program or from additional upstream hardware in the graphics process flow.

A primary advantage of the invention over prior techniques is the compression of surface normal data without significant loss of visual fidelity. Compressed normals allow graphics applications to display larger geometry data sets with high performance. The present methods are simple and fast. They can be implemented in graphics hardware with minimal cost and complexity, and they can be implemented with full graphics performance.

An additional advantage over table lookup methods is the increased precision obtained by supporting larger numbers of surface normals. This precision can be provided because the number of surface normals is not constrained to a lookup table with its system limited size. Since lookup tables are not used, this method also provides greater memory efficiency.

While the present invention has been described in detail in relation to representative embodiments thereof, the described embodiments have been presented by way of example and not by way of limitation. It will be understood by those skilled in the art that various changes may be made in the form and details of the described embodiments resulting in equivalent embodiments that remain within the scope of the appended claims.

What is claimed is:

1. A computer-implemented method for creating and storing in a memory a compressed vector representation of a surface normal, comprising the steps of:
   specifying a compression bias constant;
   accessing the surface normal, wherein vector components of the surface normal have values in a pre-specified range of compressible numbers;
   subtracting the compression bias constant from each vector component; and
   storing a pre-specified extraction field of contiguous bits from the results of the subtracting step for each vector component.

2. The method of claim 1, providing the compression bias constant and the vector components are expressed as floating-point-format numbers.

3. A computer-implemented method for creating and storing in a memory a compressed vector representation of a surface normal, comprising the steps of:
   specifying an extraction bit position;
   specifying a compression bias constant;
   accessing the surface normal, wherein the surface normal comprises a first vector component, a second vector component, and a third vector component, and wherein the vector components have values in a pre-specified range of compressible numbers;

assigning memory to a first compressed vector component representation, a second compressed vector component representation, and a third compressed vector component representation, wherein the number of bits in each of the compressed vector component representations is equal to a previously specified compressed representation field size;

selecting one of the vector components and one of the compressed vector component representations;

when the selected vector component is less than zero, determining an absolute value of the selected vector component, and subtracting the compression bias constant from the absolute value of the selected vector component to obtain a difference value, wherein the subtracting step is performed in a manner that treats the compression bias constant and the absolute value of the selected vector component as though they were both fixed-point-format binary numbers, otherwise, subtracting the compression bias constant from the selected vector component to obtain the difference value, wherein the subtracting step is performed in a manner that treats the compression bias constant and the selected vector component as though they were both fixed-point-format binary numbers;

when the difference value is less than or equal to zero, storing zero in the selected compressed vector component representation, otherwise, storing in the selected compressed vector component representation a field of contiguous bits within the difference value, such that the number of bits in the field of contiguous bits is equal to the compressed representation field size, the bit position of the most significant bit in the field of contiguous bits corresponds to the extraction bit position in the difference value, and the most significant bit of the selected compressed vector component corresponds to the most significant bit of the field of contiguous bits;

beginning with the selecting method step, repeating the above method steps for each of the vector components and each of the compressed vector component representations not previously selected.

4. The method of claim 3, providing the extraction bit position is a bit position in floating-point-formt numbers, and providing the compression bias constant and the vector components are expressed as floating-point-format numbers.

5. The method of claim 3, further comprising the steps of:

storing the algebraic sign bit of the first vector component as a first compressed algebraic sign;

storing the algebraic sign bit of the second vector component as a second compressed algebraic sign; and storing the algebraic sign bit of the third vector component as a third compressed algebraic sign.

6. The method of claim 3, providing the range of compressible numbers includes all numbers having absolute values less than or equal to one.

7. The method of claim 3, wherein the method step specifying the extraction bit position comprises the steps of:

specifying a largest non-compressed number, wherein the largest non-compressed number is the absolute magnitude of the largest vector component in the range of compressible numbers;

identifying a smallest, non-zero non-compressed number, wherein within the range of compressible numbers the smallest, non-zero non-compressed number is the absolute magnitude of the smallest vector component which is non-zero;

subtracting the smallest, non-zero non-compressed number from the largest non-compressed number; and setting the extraction bit position equal to the bit position of the most significant bit which contains a one in the result of the method step of subtracting the smallest, non-zero non-compressed number from the largest non-compressed number.

8. The method of claim 3, wherein the method step specifying the compression bias constant comprises the steps of:

specifying a largest non-compressed number, wherein the largest non-compressed number is the absolute magnitude of the largest vector component in the range of compressible numbers;

specifying a compression rounding constant, wherein the compression rounding constant is comprised of the same number of bits as the vector components;

subtracting the compression rounding constant from the largest non-compressed number, wherein the subtracting step is performed in a manner that treats the compression rounding constant and the largest non-compressed number as though they were both fixed-point-format binary numbers; and in the compression bias constant placing the result of the method step of subtracting the compression rounding constant from the largest non-compressed number.

9. The method of claim 8, wherein the method step specifying the compression rounding constant crimpses the steps of:

beginning with the extraction bit position in the compression rounding constant and extending toward the least significant bit, placing a one in each of the corresponding contiguous compressed representation field size bits; and placing zeros in all other bit positions of the compression rounding constant.

10. The method of claim 8, wherein the method step specifying the compression rounding constant comprises the steps of:

beginning with the exaction bit position in the compression rounding constant and extending toward its least significant bit, placing a one in each of the corresponding contiguous compressed representation field size plus one bits; and placing zeros in all other bit positions of the compression rounding constant.

11. The method of claim 8, wherein the method step specifying the compression rounding constant comprises the steps of:

beginning with the extraction bit position in the compression rounding constant and extending to its least significant bit, placing a one in each of the corresponding contiguous bits; and placing zeros in all other bit positions of the compression rounding constant.

12. A computer program storage medium readable by a computer, tangibly embodying a computer program of instructions executable by the computer to perform method steps for creating and storing in a memory a compressed vector representation of a surface normal, the steps comprising:

specifying a compression bias constant;

accessing the surface normal, wherein vector components of the surface normal have values in a pre-specified range of compressible numbers;

subtracting the compression bias constant from each vector component; and storing a pre-specified extraction field of contiguous bits from the results of the subtracting step for each vector component.

13. The computer program storage medium of claim 12, providing the compression bias constant and the vector components are expressed as floating-point-format numbers.

14. A computer program storage medium readable by a computer, tangibly embodying a computer program of instructions executable by the computer to perform method steps for creating and storing in a memory a compressed vector representation of a surface normal, the steps comprising:

specifying an extraction bit position;

specifying a compression bias constant;

accessing the surface normal, wherein the surface normal comprises a first vector component, a second vector component, and a third vector component, and wherein the vector components have values in a pre-specified range of compressible numbers;

assigning memory to a first compressed vector component representation, a second compressed vector component representation, and a third compressed vector component representation, wherein the number of bits in each of the compressed vector component representations is equal to a previously specified compressed representation field size;

selecting one of the vector components and one of the compressed vector component representations;

when the selected vector component is less than zero,
    determining an absolute value of the selected vector component, and
    subtracting the compression bias constant from the absolute value of the selected vector component to obtain a difference value, wherein the subtracting step is performed in a manner that treats the compression bias constant and the absolute value of the selected vector component as though they were both fixed-point-format binary numbers, otherwise,
    subtracting the compression bias constant from the selected vector component to obtain the difference value, wherein the subtracting step is performed in a manner that treats the compression bias constant and the selected vector component as though they were both fixed-point-format binary numbers;

when the difference value is less than or equal to zero,
    storing zero in the selected compressed vector component representation, otherwise,
    storing in the selected compressed vector component representation a field of contiguous bits within the difference value, such that the number of bits in the field of contiguous bits is equal to the compressed representation field size, the bit position of the most significant bit in the field of contiguous bits corresponds to the extraction bit position in the difference value, and the most significant bit of the selected compressed vector component representation corresponds to the most significant bit of the field of contiguous bits;

beginning with the selecting method step, repeating the above method steps for each of the vector components and each of the compressed vector component representations not previously selected.

15. The computer program storage medium of claim 14, providing the extraction bit position is a bit position in floating-point-format numbers, and providing the compression bias constant and the vector components are expressed as floating-point-format numbers.

16. The computer program storage medium of claim 14, the steps further comprising:

storing the algebraic sign bit of the first vector component as a first compressed algebraic sign;

storing the algebraic sign bit of the second vector component as a second compressed algebraic sign; and storing the algebraic sign bit of the third vector component as a third compressed algebraic sign.

17. The computer program storage medium of claim 14, providing the range of compressible numbers includes all numbers having absolute values less than or equal to one.

18. The computer program storage medium of claim 14, the step for specifying the extraction bit position further comprising:

specifying a largest non-compressed number, wherein the largest non-compressed number is the absolute magnitude of the largest vector component in the range of compressible numbers;

identifying a smallest, non-zero non-compressed number, wherein within the range of compressible numbers the smallest, non-zero non-compressed number is the absolute magnitude of the smallest vector component which is non-zero;

subtracting the smallest, non-zero non-compressed number from the largest non-compressed number; and setting the extraction bit position equal to the bit position of the most significant bit which contains a one in the result of the method step of subtracting the smallest, non-zero non-compressed number from the largest non-compressed number.

19. The computer program storage medium of claim 14, the step for specifying the compression bias constant further comprising:, specifying a largest non-compressed number, wherein the largest non-compressed number is the absolute magnitude of the largest vector component in the range of compressible numbers;

specifying a compression rounding constant, wherein the compression rounding constant is comprised of the same number of bits as the vector components;

subtracting the compression rounding constant from the largest non-compressed number, wherein the subtracting step is performed in a manner that treats the compression rounding constant and the largest non-compressed number as though they were both fixed-point-format binary numbers; and in the compression bias constant placing the result of the method step of subtracting the compression rounding constant from the largest non-compressed number.

20. The computer program storage medium of claim 19, the step specifying the compression rounding constant further comprising:

beginning with the extraction bit position in the compression rounding constant and extending toward the least significant bit, placing a one in each of the corresponding contiguous compressed representation field size bits; and placing zeros in all other bit positions of the compression rounding constant.

21. The computer program storage medium of claim 19, the step for specifying the compression rounding constant further comprising:

beginning with the exaction bit position in the compression rounding constant and extending toward its least significant bit, placing a one in each of the corresponding contiguous compressed representation field size plus one bits; and placing zeros in all other bit positions of the compression rounding constant.

22. The computer program storage medium of claim 19, the step for specifying the compression rounding constant further comprising:

beginning with the extraction bit position in the compression rounding constant and extending to its least significant bit, placing a one in each of the corresponding contiguous bits; and placing zeros in all other bit positions of the compression rounding constant.

23. A computer system for creating and storing in a memory a compressed vector representation of a surface normal, comprising:

a first arithmetic logic circuit configured to access data for accessing the surface normal, wherein the surface normal comprises a first vector component, a second vector component, and a third vector component, and wherein the vector components have values in a specified range of compressible numbers;

a second arithmetic logic circuit configured to take an absolute value of a number for, when one selected vector component is less than zero, taking an absolute value of the selected vector component;

a third arithmetic logic circuit configured to subtract one number from another for, when the selected vector component is less than zero, subtracting a specified compression bias constant from the absolute value of the selected vector component to obtain a difference value, wherein the subtraction is performed in a manner that treats the compression bias constant and the absolute value of the selected vector component as though they were both fixed-point-format binary numbers, otherwise, subtracting the compression bias constant from the selected vector component to obtain a difference value, wherein the subtraction is performed in a manner that treats the compression bias constant and the selected vector component as though they were both fixed-point-format binary numbers; and a fourth arithmetic logic circuit configured to copy data from one location in the memory to another for, when the difference value is less than or equal to zero, copying zero into a selected compressed vector component representation, otherwise, copying into the selected compressed vector component representation a field of contiguous bits within the difference value, such that the number of bits in the field of contiguous bits is equal to a specified compressed representation field size, the bit position of the most significant bit in the field of contiguous bits corresponding to a specified extraction bit position in the difference value, and the most significant bit of the selected compressed vector component representation corresponding to the most significant bit of the field of contiguous bits.

24. The computer system of claim 23, wherein the fourth arithmetic logic circuit configured to copy data is for further copying the algebraic sign bit of the first vector component as a part of a first compressed vector component representation, copying the algebraic sign bit of the second vector component as a part of a second compressed vector component representation, and copying the algebraic sign bit of the third vector component as a part of a third compressed vector component representation.

25. The computer system of claim 23 wherein:

the third arithmetic logic circuit configured to subtract is for further subtracting a smallest, non-zero non-compressed number from a largest non-compressed number, wherein within the range of compressible numbers the smallest, non-zero non-compressed number is the absolute magnitude of the smallest vector component which is non-zero and wherein the largest non-compressed number is the absolute magnitude of the largest vector component in the range of compressible numbers; and the fourth arithmetic logic circuit configured to copy data is for further copying the bit position number of the most significant bit which contains a one in the result of the subtraction of the smallest, non-zero non-compressed number from the largest non-compressed number into the extraction bit position.

26. The computer system of claim 23 wherein:

the third arithmetic logic circuit configured to subtract is for further subtracting a specified compression rounding constant from a largest non-compressed number, wherein the compression rounding constant is comprised of the same number of bits as the vector components, wherein the largest non-compressed number is the absolute magnitude of the largest vector component in the range of compressible numbers, and wherein the subtraction is performed in a manner that treats the compression rounding constant and the largest non-compressed number as though they were both fixed-point-format binary numbers; and the fourth arithmetic logic circuit configured to copy data is for further copying the result of the subtraction of the compression rounding constant from the largest non-compressed number into the compression bias constant.

27. The computer system of claim 26, wherein:

the fourth arithmetic logic circuit configured to copy data is for further copying, beginning with the extraction bit position in the compression rounding constant and extending toward the least significant bit, a one into each of the corresponding contiguous compressed representation field size bits; and the fourth arithmetic logic circuit configured to copy data is for further copying zeros into all other bit positions of the compression rounding constant.

28. The computer system of claim 26, wherein:

the fourth arithmetic logic circuit configured to copy data is for further copying, beginning with the extraction bit position in the compression rounding constant and extending toward its least significant bit, a one into each of the corresponding contiguous compressed representation field size plus one bits; and the fourth arithmetic logic circuit configured to copy data is for further copying zeros into all other bit positions of the compression rounding constant.

29. The computer system of claim 26 wherein:

the fourth arithmetic logic circuit configured to copy data is for further copying, beginning with the extraction bit position in the compression rounding constant and extending to its least significant bit, a one into each of the corresponding contiguous bits; and the fourth arithmetic logic circuit configured to copy data is for further copying zeros into all other bit positions of the compression rounding constant.

* * * * *